(12) United States Patent
Ito et al.

(10) Patent No.: US 6,683,767 B2
(45) Date of Patent: Jan. 27, 2004

(54) SEMICONDUCTOR INTEGRATED CIRCUIT

(75) Inventors: Takayasu Ito, Higashimurayama (JP); Mitsuru Hiraki, Kodaira (JP); Koichi Ashiga, Higashiyamato (JP)

(73) Assignees: Hitachi, Ltd., Tokyo (JP); Hitachi Device Engineering Co., Ltd., Chiba (JP)

( * ) Notice: Subject to any disclaimer, the term of this patent is extended or adjusted under 35 U.S.C. 154(b) by 356 days.

(21) Appl. No.: 09/874,001

(22) Filed: Jun. 6, 2001

(65) Prior Publication Data
US 2001/0054760 A1 Dec. 27, 2001

(30) Foreign Application Priority Data

Jun. 22, 2000 (JP) .......................... 2000-192643
Apr. 26, 2001 (JP) .......................... 2001-128676

(51) Int. Cl.[7] .............................. H02H 4/00; G05F 1/59
(52) U.S. Cl. .......................................... 361/56; 323/268
(58) Field of Search ............................. 361/18, 56, 90, 361/100, 111; 327/538, 540, 545; 323/268, 270–272

(56) References Cited

U.S. PATENT DOCUMENTS 4,931,665 A * 6/1990 Yee ............................. 327/538
5,675,280 A * 10/1997 Nomura et al. ............. 327/538
6,424,128 B1 * 7/2002 Hiraki et al. ................ 323/268

FOREIGN PATENT DOCUMENTS

JP    2-224267    9/1990
JP    9-289288    11/1997

* cited by examiner

Primary Examiner—Gregory J. Toatley, Jr.
Assistant Examiner—Boris Benenson
(74) Attorney, Agent, or Firm—Miles & Stockbridge P.C.

(57) ABSTRACT

An integrated circuit formed on a semiconductor chip includes voltage regulators for stepping down an externally-supplied power voltage to produce an internal power voltage, and internal circuits which operate based on the internal power voltage. The voltage regulators are laid in the area of the buffers and protective elements for the input/output signals and power voltages so that the overhead area due to the on-chip provision of the voltage regulators is minimized. The internal power voltage is distributed to the internal circuits through a looped main power line, with an electrode pad for connecting an external capacitor for stabilizing the internal power voltage being provided on it, so that the internal power voltage is stabilized and the power consumption of the integrated circuit is minimized.

35 Claims, 29 Drawing Sheets

| OPERATION MODE | REFERENCE VOLTAGE GENERATION CIRCUIT | SERIES REGULATOR | SMALL SERIES REGULATOR FOR STANDBY | SUBSTRATE BIAS CONTROL CIRCUIT |
|---|---|---|---|---|
| ACTIVE | ON | ON | OFF | OFF |
| STANDBY | ON | OFF | ON | ON |
| DATA HOLD | ON | OFF | ON | ON |
| SHUT-DOWN | OFF | OFF | OFF | OFF |

CIRCUIT CONNECTION DATA

CIRCUIT SYMBOL DATA

SEMICONDUCTOR INTEGRATED CIRCUIT

BACKGROUND OF THE INVENTION

The present invention relates to a semiconductor integrated circuit which incorporates voltage regulators for stepping down the externally-supplied power voltage, and to a technique which is applied effectively to data processing systems, such as portable information terminals, having their semiconductor chips required to be smaller in size and power consumption.

Among semiconductor integrated circuits having internal circuits which operate based on an internal power voltage (Vint: 1.8 V, 1.5 V, etc.) lower than an external power voltage (Vext: 3.3 V, 5.0 V, etc.), there are some integrated circuits having a voltage step-down circuit which steps down an external power voltage to produce an internal power voltage. With the intention of reducing the voltage drop of the internal power voltage caused by the parasitic resistance of wires from the voltage step-down circuit to the internal circuits, there is known a technique of building multiple voltage step-down circuits on the chip and laid near the power pads so that the voltage drop of the external power voltage caused by the parasitic resistance of the wires from the power pads to the voltage step-down circuits is reduced.

Publications pertinent to this technique include Japanese Patent Unexamined Publications No. Hei 9 (1997)-289288 and No. Hei 2 (1990)-224267.

SUMMARY OF THE INVENTION

The inventors of the present invention have studied these prior arts to find the following affairs.

The prior arts are designed to lay voltage step-down circuits near the power pads so as to minimize the voltage drop of the internal power voltage caused by the parasitic resistance of the wires from the voltage step-down circuits to the internal circuits and minimize the voltage drop of the external power voltage on the wires from the power pads to the voltage step-down circuits. However, these prior arts do not consider the increase of chip area due to the on-chip provision of the voltage step-down circuits and do not present clearly the scheme of reducing this overhead chip area.

The inventors of the present invention have contemplated to foster the reduction of power consumption by use of a step-down power voltage, and found that it is beneficial to control the step-down voltage level depending on the operational state of the semiconductor integrated circuit and use the step-down power voltage or external power voltage selectively in controlling the threshold voltage of MOS transistors by varying the substrate voltage for the reduction of sub-threshold leak current of the circuits which operate based on the step-down power voltage.

An object of the present invention is to provide a semiconductor integrated circuit which is capable of minimizing the increase of chip area caused by the on-chip provision of voltage regulators which step down the external power voltage and also stabilizing the step-down voltage.

Another object of the present invention is to provide a semiconductor integrated circuit which is capable of advancing the power conservation based on the use of step-down voltages.

Still another object of the present invention is to provide a technique which facilitates the design of semiconductor integrated circuits which are intended to minimize the increase of chip area caused by the on-chip provision of voltage regulators for stepping down the external power voltage and stabilize the step-down voltage.

The above, other objects and novel features of the present invention will become apparent from the description of the present specification and the accompanying drawings.

Among the affairs of the present invention disclosed in this specification, representatives are briefed as follows.

(1) Buffer and Protection Circuit Area

The inventive semiconductor integrated circuit has on a semiconductor chip (10) a first area (1) for laying external terminals (20) such as the electrode pads for the input/output signals and power voltages. The first area (1) is adjoined by a second area (2) for laying buffers and protection circuits pertinent to the input/output signals and power voltages. The second area (2) is also used for laying multiple voltage regulators (150–157) which step down a first power voltage (Vext) supplied from the outside of the semiconductor chip (10) to produce at least one kind of internal power voltage (Vint) which is lower than Vext. The voltage regulators are laid in the area having its width generally determined from the layout width of buffers and protection circuits and at positions near the external terminals of the first power voltage and ground voltage. There is a third area for laying first internal circuits which operate based on the internal power voltage.

The portions of the second area near the external terminals of the first power voltage and ground voltage are not used to lay buffers, which are laid solely near the external terminals of signals, and accordingly these portions are inherently less crowded and readily available for the layout of voltage regulators. The buffers and protection circuits are basically provided for individual external terminals and they are smaller in number as compared with circuits in the whole semiconductor integrated circuit, and the area corresponding to the second area is conceived to be an area having a space where the voltage regulators can be formed.

By using the second area having its width generally determined from the layout width of buffers and protection circuits to lay multiple voltage regulators, it is relatively easy to increase the number of regulators without increasing the chip area proportionally. Accordingly, this layout scheme readily minimizes the increase of chip area due to the on-chip provision of voltage regulators which step down the external power voltage, and moreover achieves the stabilization of the step down voltage by allowing the supply of a large current to the first internal circuits.

(2) Main Power Line

The semiconductor integrated circuit has power lines including a main power line (L20) which is connected to the outputs of the voltage regulators for distributing the internal power voltage to the first internal circuits. Preferably, the main power line is formed to be a closed loop, so that the internal power voltage is constant throughout the power line and supplied stably to many scattering circuits located on the semiconductor chip.

The main power line is laid to have a generally equal parasitic resistance between output nodes of voltage regulators, so that the internal power voltage has an even voltage level throughout the line. This is attainable by making a generally equal distance between output nodes of voltage regulators on the main power line.

For coping with a limited area available for the voltage regulators to be integrated on the semiconductor chip, it is advantageous to adopt series voltage regulators, with a stabilizing capacitor (C10) being attached externally to the chip by the provision of an external terminal (20A-2) which is connected to the main power line.

(3) Signal Level Converting Circuit

In regard to the transfer of signals between a circuit which operates based on the first power voltage and a circuit which operates based on the internal power voltage, the former circuit can send the signal directly to the latter circuit. In another case of putting a signal from the latter circuit to the former circuit, the former circuit receives a signal level lower than the power voltage, for example, the input signal level of a CMOS circuit can be logically intermediate, causing possibly the creation of a undesired through-current. For preventing this event from occurring, second internal circuits which operate based on the first power voltage are provided with level converting circuits (G3) which convert the output signals of the first internal circuits to have logic levels derived from the first power voltage. Specifically, for example, a first logic circuit provides the output signal for a buffer in the second area via the level converting circuit.

(4) Reference Voltage Generation Circuit

In case the voltage regulators necessitate a reference voltage for producing a specified step-down voltage, a reference voltage generation circuit (60) is formed as a second internal circuit which operates based on the first power voltage. The reference voltage is supplied to the voltage regulators through an open-loop reference voltage line (L10) if it is intended to minimize the antenna effect of the line. The reference voltage supply line is laid to run generally along the layout of voltage regulators, with a grounded shield line being formed on the same wiring layer. Additional shield lines or shield areas may be formed above and below the reference voltage supply line, so that the fluctuation of reference voltage caused by crosstalk is minimized.

With the intention of coping with the disparity of characteristics of semiconductor integrated circuits, the reference voltage may be produced by a reference voltage generator (100) having its characteristics determined by trimming information which is held in an electrically-erasable nonvolatile memory. The trimming information is calculated based on the measurement of characteristics of individual reference voltage generators during the wafer probe test and stored in the nonvolatile memory (135). At the initializing process of the semiconductor integrated circuit, the reference voltage generator reads out to latch the trimming information out of the nonvolatile memory and produces a reference voltage in accordance with the latched trimming information so as to offset the deviated characteristics.

The reference voltage generation circuit may be designed to produce a reference voltage which is selected out of multiple kinds of reference voltages. For example, in case the semiconductor integrated circuit operates in synchronism with a clock signal, the reference voltage generation circuit produces a lower reference voltage in order to provide a lower clock frequency for the low speed operation of the first circuits, or produces a higher reference voltage in order to provide a higher clock frequency for the high speed operation.

The selection of reference voltage may be controlled in response to a command which is given by a control means, such as the CPU (120), depending on the operation mode to the reference voltage generation circuit. Specifically, for example, a semiconductor integrated circuit of a microprocessor or data processor is designed to select the lower reference voltage in the standby mode or sleep mode, and select the higher reference voltage in the active mode.

(5) Regulator Activation Control

With the intention of reducing the power consumption of the semiconductor integrated circuit, it is designed to include as a second internal circuit a regulator activation control means (70) for turning on or off the voltage regulators. The activation control means can control each of or each group of voltage regulators separately. Specifically, for example, all voltage regulators are turned on in the active mode, and only part of regulators are turned on in the standby mode or sleep mode. Alternatively, part of the regulators are designed to have a smaller power capacity, and only these regulators are turned on in the standby mode or sleep mode.

One or a small number of sub voltage regulators (80) may be formed in a fourth area as second internal circuits which are based on the first power voltage, with the regulator activation control means (70) being adapted to turn on the voltage regulator of the second area in response to a first operation mode such as the active mode of the semiconductor integrated circuit and turn on the sub voltage regulator in response to a second operation mode such as the standby mode or sleep mode of the semiconductor integrated circuit.

(6) Switching Power Regulator Control

The on-chip voltage regulators of the semiconductor integrated circuit may not suffice for the power supply. For coping with this matter readily, the semiconductor chip having several voltage regulators is designed to include as a second circuit a driver control circuit (90) for a switching power regulator which is assumed to be attached externally, with some external terminals (20B-1,20B-2) being allotted to the output signals of the external driver control circuit.

The external switching regulator, when attached to the semiconductor integrated circuit, has its voltage output terminal connected to a certain external terminal (20B-3), which is connected with the output nodes of voltage regulators on the main power line which supplies the internal power voltage to the first internal circuits. In this case, the on-chip voltage regulators do not need to operate. The semiconductor integrated circuit includes a deactivation control means (70,135) which deactivates one of the voltage regulators or the driver control circuit of switching regulator permanently. Specifically, for example, the deactivation control means is a power fuse or a flash memory fuse formed of an electrically-erasable nonvolatile memory element.

The semiconductor integrated circuit needs to include only the driver control circuit which merely takes up a relatively small chip area, while allowing for the selection of output power transistor of external switching regulator depending on the power capacity required.

(7) Substrate Bias Control Circuit

Switching elements such as MOS (metal oxide semiconductor) transistors or MIS (metal insulated semiconductor) transistors have their operation speed and sub-threshold leak current depending on their threshold voltage. The operation frequency can be raised by lowering the threshold voltage, however, setting a too low threshold voltage will fail to cutting off completely MOS transistors due to their sub-threshold characteristics, resulting in an increased sub-threshold leak current and an extremely large power dissipation of the semiconductor integrated circuit. Applying a forward substrate bias voltage to a switching transistor lowers the threshold voltage, resulting in a much faster operation, whereas applying a reverse substrate bias voltage to a switching transistor raises the threshold voltage, resulting in a smaller sub-threshold leak current in the nonconductive state and a smaller power dissipation.

The substrate biasing is to make the substrate voltage different from the source voltage of switching transistors. If an n-channel MOS transistor is brought to have a substrate voltage lower than the source voltage (i.e., state of reverse bias), the threshold voltage becomes higher as compared with the state of no bias, or if it is brought to have a substrate voltage higher than the source voltage (i.e., state of forward bias), the threshold voltage becomes lower as compared with the state of no bias. If a p-channel MOS transistor is brought to have a substrate voltage higher than the source voltage (i.e., state of reverse bias), the threshold voltage becomes higher as compared with the state of no bias, or if it is brought to have a substrate voltage lower than the source voltage (i.e., state of forward bias), the threshold voltage becomes lower as compared with the state of no bias.

The semiconductor integrated circuit having the voltage regulators is provided, as a second internal circuit operating based on the first power voltage, with a substrate bias control circuit (71) which manipulates the substrate voltage of the switching elements, which form the first internal circuits, by utilization of the first power voltage and internal power voltage depending on the operation mode of the semiconductor integrated circuit. Specifically, for example, the switching elements are brought to the state of reverse substrate bias, so that the switching transistors have a higher threshold voltage and a smaller sub-threshold leak current, when the semiconductor integrated circuit is in the standby mode or sleep mode in which the internal circuits are not virtually operable. In the active mode, the substrate may be given no bias voltage application and left at the same voltage as the source of switching transistors.

As a specific control scheme, the substrate bias control circuit establishes the substrate voltages of the first internal circuits to be the internal power voltage and ground voltage during the first operation mode such as the active mode of the semiconductor integrated circuit, and establishes the substrate voltages to be the first power voltage and a negative voltage which results from step-down of the ground voltage during the second operation mode such as the standby mode or sleep mode.

(8) Design of Semiconductor Integrated Circuit

A semiconductor integrated circuit having the voltage regulators is designed by including step of layout of the regulators in the area having its width generally determined from the layout width of buffers and at positions near the external terminals of the first power voltage and ground voltage. The design of semiconductor integrated circuit will be facilitated by the provision of a cell library, from which voltage regulators that meet the power capacity demanded by the first internal circuits are selected.

(9) The semiconductor integrated circuit seen from another viewpoint of this invention has its voltage regulators made up of an amplifier section which is located in the area where the buffers and protection circuits in connection with the external terminals are formed and a transistor circuit section which is located in the area inner than the area of the buffers and protection circuits.

Specifically, for example, the semiconductor chip has a terminal area (1) where a number of external terminals are located, a first circuit area (outer side of area 2) where the buffers, protection circuits and a number of voltage regulators for stepping down a first power voltage supplied from the outside and received on a certain terminal to produce at least one kind of internal power voltage which is lower than the first power voltage are laid, a second circuit area (3) where first internal circuits which operate based on the internal power voltage are laid, and a third circuit area (4) where second internal circuits which operate based on the first power voltage are laid, with the amplifier section being included in the first circuit area. The transistor circuit section is included in the area between the first circuit area and the second circuit area, or in the area (inner side of area 2) between the first circuit area and the third circuit area.

In consequence, the latitude of layout of the voltage regulators increases.

DESCRIPTION OF THE PREFERRED EMBODIMENTS

Figure 1:
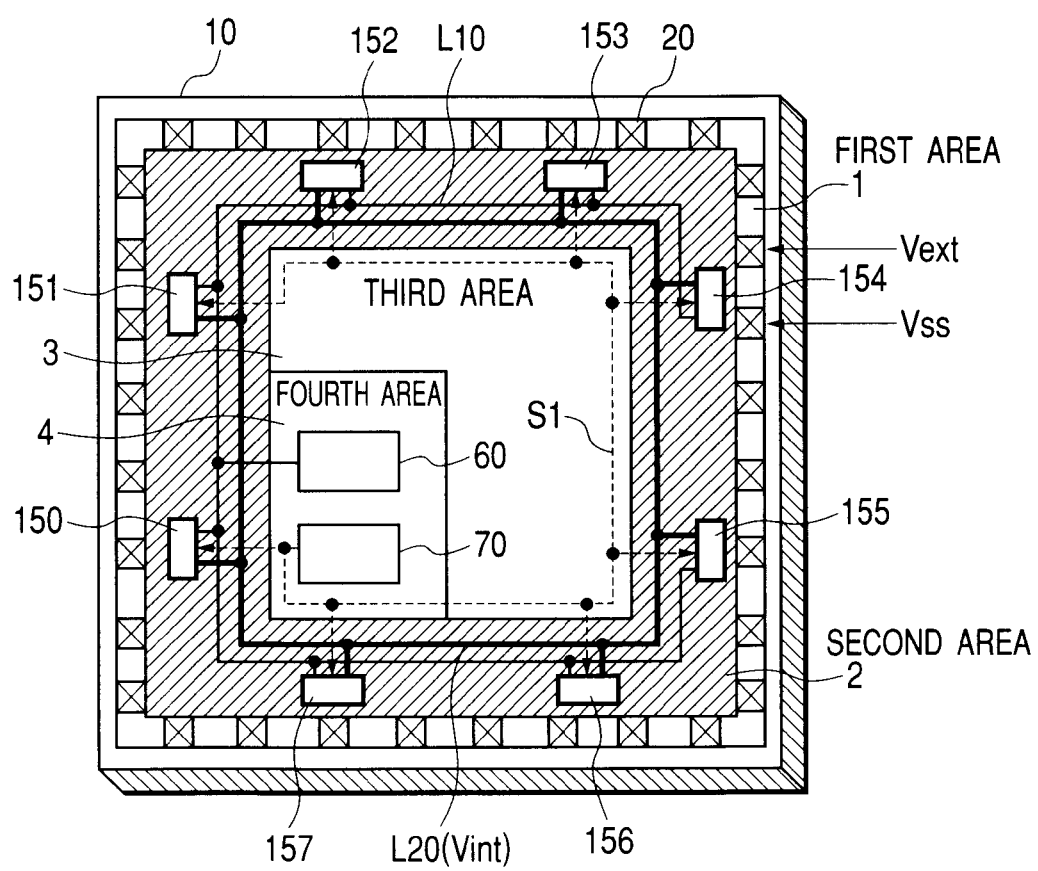
FIG. 1 is a diagram used to explain an embodiment of the semiconductor integrated circuit based on this invention.

FIG. 1 shows the first embodiment of the semiconductor integrated circuit based on this invention. A semiconductor chip 10 has an encircled formation of a first area 1, in which are laid a number of external terminals, e.g., electrode pads, 20 used for the transaction of input/output signals and power voltages with the outside. In contiguous with the first area 1 on the chip 10, there is an encircled formation of a second area 2, which is used to lay buffers and protective elements for the input/output signals and power voltages. The second area 2 has a constant width which is generally determined from the size of the buffers and protective elements.

There is a third area 3, which is used to lay internal circuits operating based on an internal power voltage Vint which is lower than a first power voltage (will be termed "external power voltage") Vext used for the interface of the semiconductor chip 10. There is a fourth area 4, which is used to lay internal circuits operating based on the external power voltage Vext.

With the intention of minimizing the overhead chip area due to the on-chip provision of a voltage step-down circuit, a number of voltage regulators 150–157 are laid in the second area 2. The second area 2, which is inherently used solely to lay the input/output buffers and protective elements, is more roomy as compared with the third and fourth areas.

In this embodiment, the voltage regulators 150–157 are series regulators. The series regulators 150–157 receive through a reference voltage line L10 a reference voltage which is produced by a reference voltage generation circuit 60 laid in the fourth area 4, produce an internal power voltage in accordance with the reference voltage, and release the produced voltage to a power line, e.g., main power line L20. The reference voltage line L10 is laid to run in the second area 2 or the border section thereof.

The reference voltage line L10 has its one portion cut away to from an open-loop line, thereby minimizing the antenna effect.

The series regulators 150–157 are supplied with the external power voltage Vext from the outside of the chip and adapted to step down the voltage to produce the internal power voltage Vint in accordance with the reference voltage provided by the reference voltage generation circuit 60. The internal power voltage Vint is distributed to the internal circuits in the third area 3 by the main power line L20 which runs round in the second area 2 or the border section thereof. The series regulators 150–157 are turned on or off by a control signal S1 which is provided by a control circuit 70 laid in the fourth area 4. External power lines connected to the electrode pads of the external power voltage Vext and ground voltage Vss are represented by a pair of lines in FIG. 1.

In the embodiment shown in FIG. 1, the series regulators 150–157 have their output nodes located on the main power line L20 so that all line segments have a virtually equal parasitic resistance. Specifically, for example, these output nodes are virtually equidistant on the line L20. Consequently, the internal power voltage is made more even on the main power line L20.

Figure 2A:
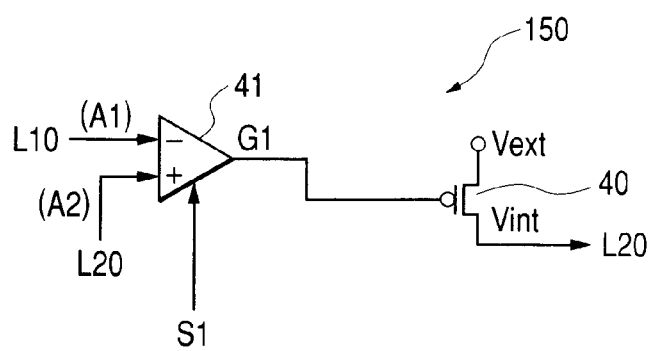
FIGS. 2A and 2B are schematic circuit diagrams showing embodiments of the series voltage regulator.
Figure 2B:
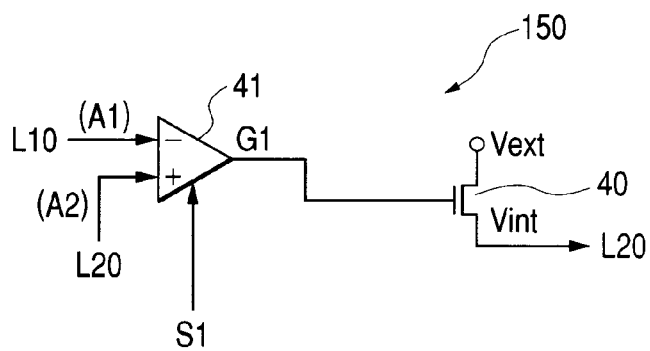

FIGS. 2A and 2B show embodiments of the series regulator 150. Other series regulators 151–157 are identical to this regulator. The series regulator 150 is made up of a differential amplifier 41 and a driver MOS transistor 40. The driver MOS transistor 40 is a p-channel MOS transistor having its source connected to the external power voltage Vext and its drain connected to the main power line L20 in the case of FIG. 2(A), while it is an n-channel MOS transistor having its drain connected to the external power voltage Vext and its source connected to the main power line L20 in case of FIG. 2(B). The differential amplifier 41 has an inverting input terminal A1 connected to the reference voltage line L10, a non-inverting input terminal A2 connected to the main power line L20, and an output terminal G1 connected to the gate of the driver MOS transistor 40. The differential amplifier 41 is activated or deactivated by the signal S1, and in its inactive state, the output terminal G1 is brought to the high level "1" in the case of FIG. 2(A) or low level "0" in the case of FIG. 2(B) so that the driver MOS transistor 40 is cut off.

Figure 3A:
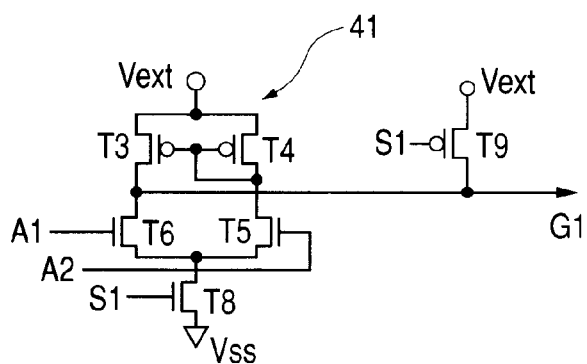
FIGS. 3A and 3B are schematic circuit diagrams showing embodiments of the differential amplifier.
Figure 3B:
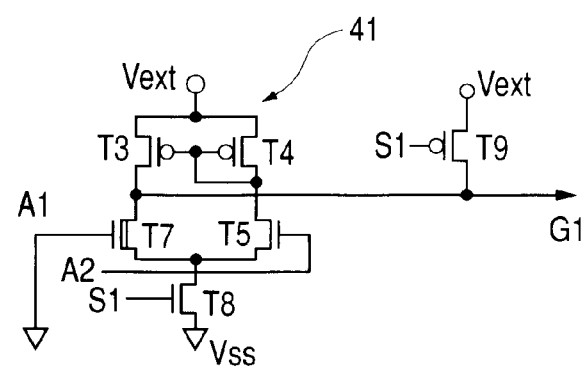

FIGS. 3A and 3B show embodiments of the differential amplifier 41. The differential amplifier 41 of FIG. 3A is the one shown in FIG. 2A. The differential amplifier 41 includes n-channel MOS transistors T6 and T5 having differential inputs and having the connection of a current-mirror load consisting of p-channel MOS transistors T3 and T4. The n-channel MOS transistors T5 and T6 have their common sources connected to an n-channel power switching MOS transistor T8 which forms a constant current source and turns on and off in response to the signal S1. The MOS transistors T3 and T6 have their common drains connected to the source of a p-channel pull-up MOS transistor T9, which turns on and off in response to the signal S1 and has its source led out to the output terminal G1. The differential amplifier 41 is activated by a high-level signal S1, and it is deactivated by a low-level signal S1 to cut off the driver MOS transistor 40. The differential amplifier 41 of FIG. 3B differs from that of FIG. 3A in that the pull-up MOS transistor T9 is replaced with a pull-down MOS transistor which is controlled by the inverted version (not shown) of the signal S1.

The differential input MOS transistors T6 and T5 shown in FIG. 3A are of the enhancement type. The MOS transistor T7 having the inverting input terminal A1 of the differential amplifier 41 shown in FIG. 3B is of the depletion type. For producing an intended voltage level on the output terminal G1, the MOS transistor T6 of the enhancement type needs to have a certain voltage provided by the reference voltage generation circuit 60 on its input terminal A1, whereas the MOS transistor T7 of the depletion type suffices to have its input terminal A1 connected simply to the ground voltage Vss instead of having the provision of the reference voltage generation circuit 60, although the control accuracy of the conductivity of the driver MOS transistor 40, i.e., the resulting internal power voltage Vint on the output terminal G1 is inferior.

Figure 4:
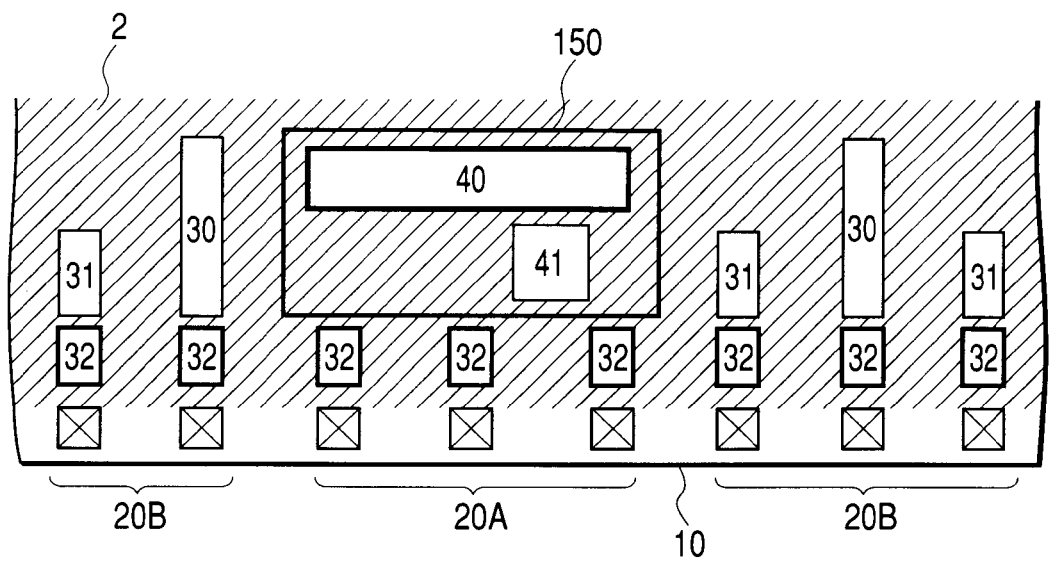
FIG. 4 is a diagram showing an embodiment of the basic layout of the series regulator.

FIG. 4 shows an embodiment of the layout of the series regulator 150. Other series regulators 151–157 (not shown) are identical to this regulator. The portion of the second area 2 near the power pads 20A does not need to lay input/output buffers 30 and 31 and is used solely to lay protective elements 32 taking small layout areas, and therefore it can be left roomy. Based on this fact, a number of power pads 20A are located concentratively in a few locations of the four sides of the semiconductor chip 10, and a resulting roomy area is used to lay the series regulator 150. The power pads 20A include electrode pads of the external power voltage Vext and ground voltage Vss. Other electrode pads indicated by 20B are for I/O signals.

Based on this layout, the provision of the series regulator 150 does not need to increase the chip area, i.e., it means the reduction of overhead chip area relative to the addition of the series regulator. The series regulator 150 uses the nearby power pads 20A, and the undesired drop of external power voltage Vext caused by the resistance and parasitic capacitance of power lines between the series regulator 150 and the power pads 20A can be minimized.

Figure 5:
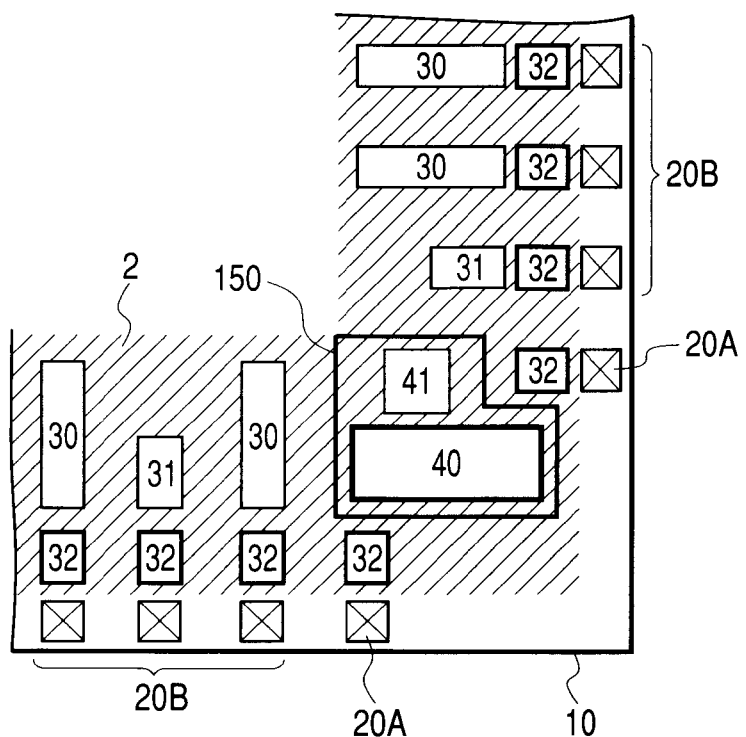
FIG. 5 is a diagram showing a layout of the series regulator in the chip corner section.

FIG. 5 shows another embodiment of the layout of the series regulator 150. A semiconductor chip 10 has roomy areas in the four corner sections of the second area 2 if electrode pads are not laid there. The series regulator 150 is placed in such area. The series regulator 150 has the allotment of the nearby power pads 20A located in both side sections near the corner. This layout scheme enables the layout of the series regulator 150 by use of a roomy area at the corner of the semiconductor chip 10 where electrode pads are absent. It is possible to place some of the series regulators 150–157 based on the layout scheme of FIG. 5, while placing the rest based on the layout scheme of FIG. 4.

Figure 6:
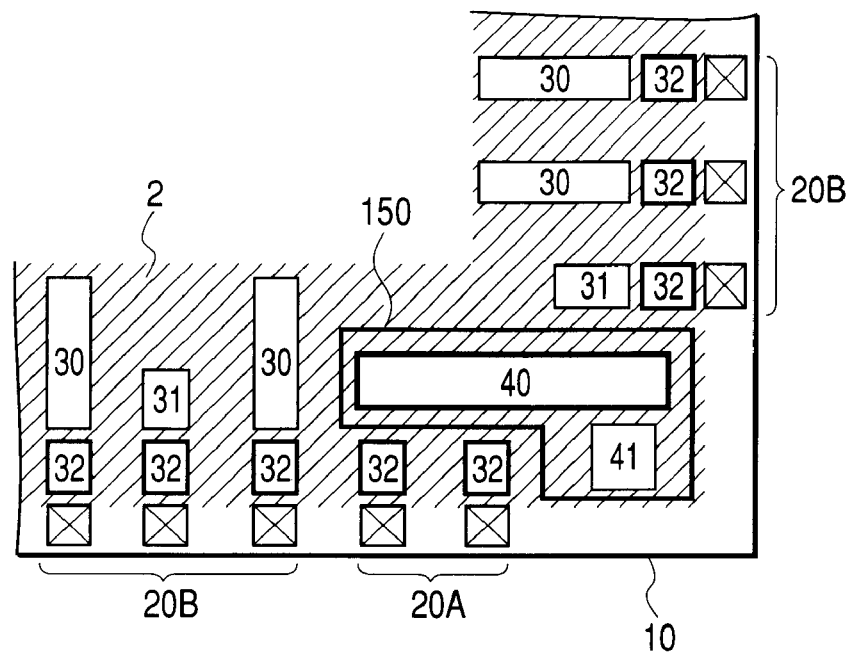
FIG. 6 is a diagram showing another layout of the series regulator in the chip corner section.

FIG. 6 shows still another embodiment of the layout of the series regulator 150. A semiconductor chip 10 has a roomy area in the corner section of the second area 2 if electrode pads are not laid there. The series regulator 150 is laid in this area, with electrode pads 20A being allotted thereto by being located on either side near the corner.

Figure 7:
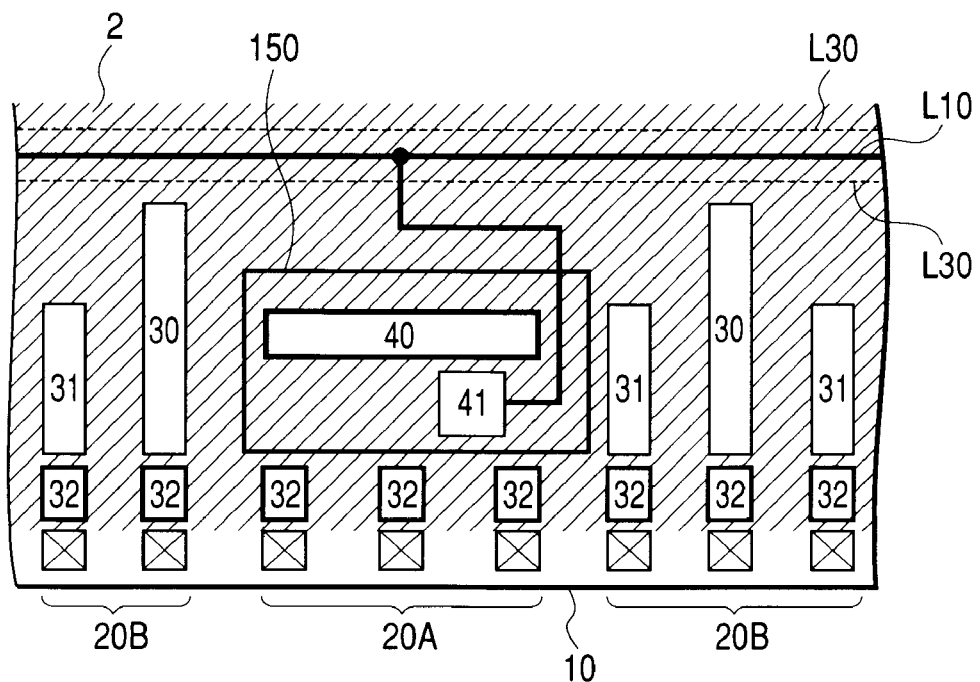
FIG. 7 is a diagram showing by plan view an embodiment of the layout of the reference voltage supply line.

FIG. 7 shows an embodiment of the layout of the reference voltage line L10. The reference voltage line L10 is laid to run in the second area 2 or the border section thereof. The reference voltage line L10 is accompanied on both sides thereof and on the same wiring layer by shield lines L30 which are given the ground voltage Vss, so that the reference voltage line L10 which carries a signal based on the internal power voltage Vint is protected from crosstalk noises.

Figure 8:
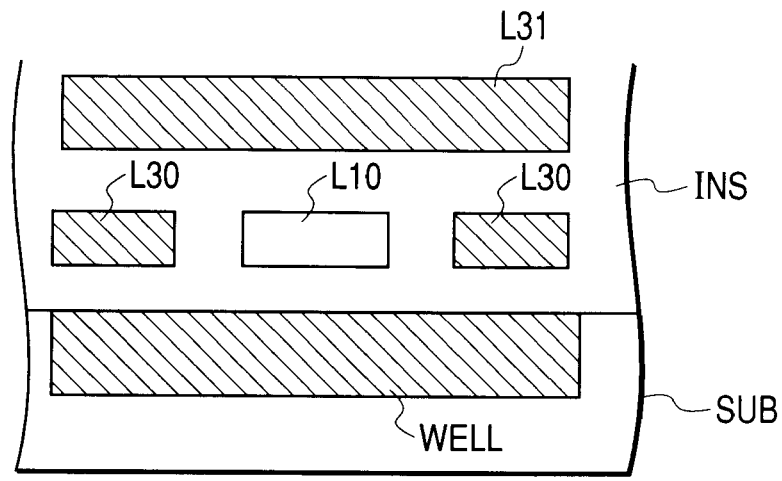
FIG. 8 is a diagram showing an embodiment of the cross-sectional structure of the substrate portion of the reference voltage supply line.

FIG. 8 shows an embodiment of the cross-sectional structure around the reference voltage line L10 in a semiconductor chip 10. With the intention of enhancing the noise protection effect by the shield lines L30 running along and on both sides of the reference voltage line L10 shown in the embodiment of FIG. 7, another shield line L31 is formed by use of the wiring layer above the reference voltage line L10 and a well (WELL) is formed as a shield area in the substrate (SUB). Both the shield line L31 and well WELL are given the ground voltage Vss. In case the reference voltage line L10 is formed on the second or higher metallic wiring layer, the well WELL may be substituted by a shield line formed on the lower wiring layer, although this arrangement is not shown. Indicated by INS in FIG. 8 is an inter-layer insulating layer.

Figure 9:
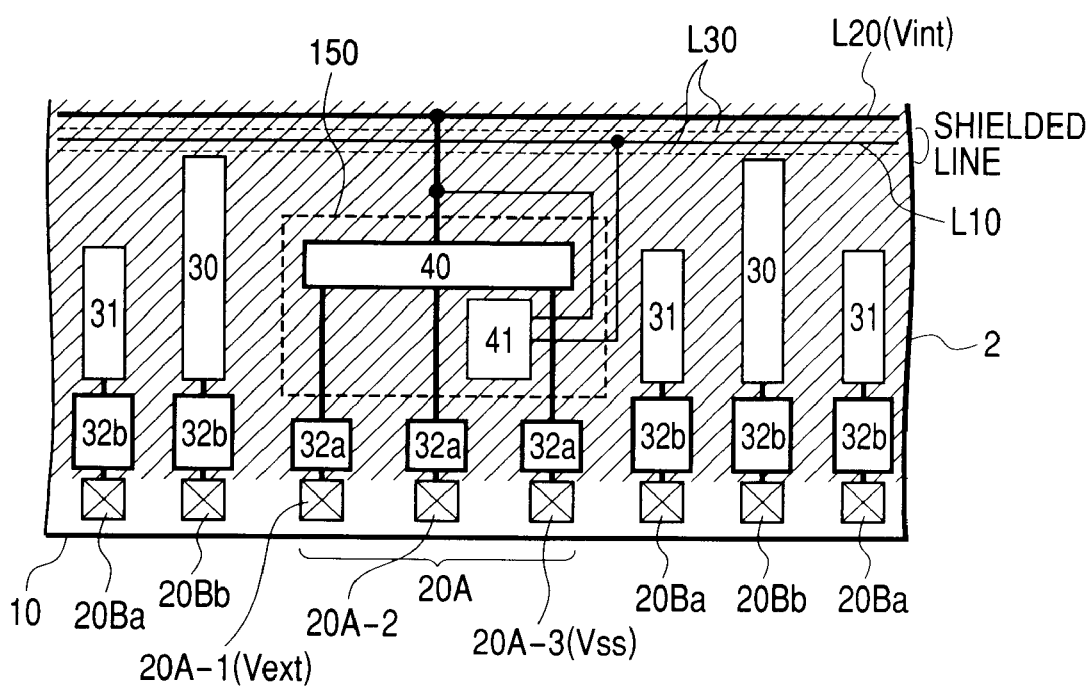
FIG. 9 is a diagram showing an embodiment of the connection of the series regulator and associated lines laid out in the second area.

FIG. 9 shows an embodiment of the connection between the series regulator and the lines in the second area 2. FIG. 10 through FIG. 13 show embodiments of the circuit arrangement of the portion shown in FIG. 9.

Figure 10:
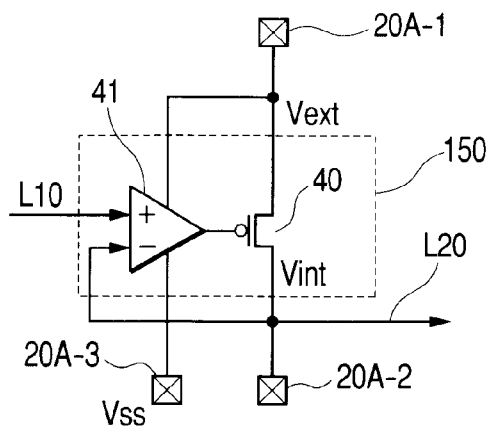
FIG. 10 is a schematic circuit diagram showing an embodiment of the connection of the series regulator to the power pads.

The series regulator 150 has the allotment of power pads 20A, which are an input terminal 20A-1 for the external power voltage Vext, an input terminal 20A-3 for the ground voltage Vss, and a terminal 20A-2 of the main power line L20 as shown in FIG. 10. The terminal 20A-2 can be used for the connection of an external stabilizing capacitor for example, and this terminal serves the entire semiconductor integrated circuit instead of being needed by each series regulator.

Figure 11:
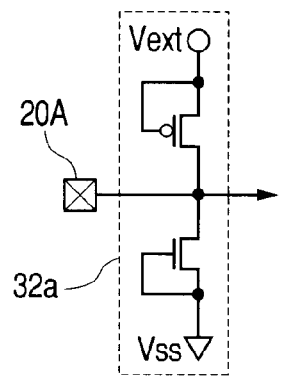
FIG. 11 is a schematic circuit diagram showing an embodiment of the power pad and protective element connected to it.

Each power pad 20A is connected with a protective element 32a. The protective element 32a is formed of a high-voltage n-channel MOS transistor having its gate connected to the ground voltage Vss and a high-voltage p-channel MOS transistor having its gate connected to the external power voltage Vext as shown in FIG. 11 for example, although this affair is not compulsory, and it operates as follows. These MOS transistors are normally in the state of reverse bias. If a negative surge voltage is applied to the power pad 20A, the n-channel MOS transistor is biased forwardly to conduct a surge current to the ground voltage Vss, or if a positive surge voltage is applied to the power pad 20A, the p-channel MOS transistor is biased forwardly to conduct a surge current to the external power voltage Vext.

Figure 12:
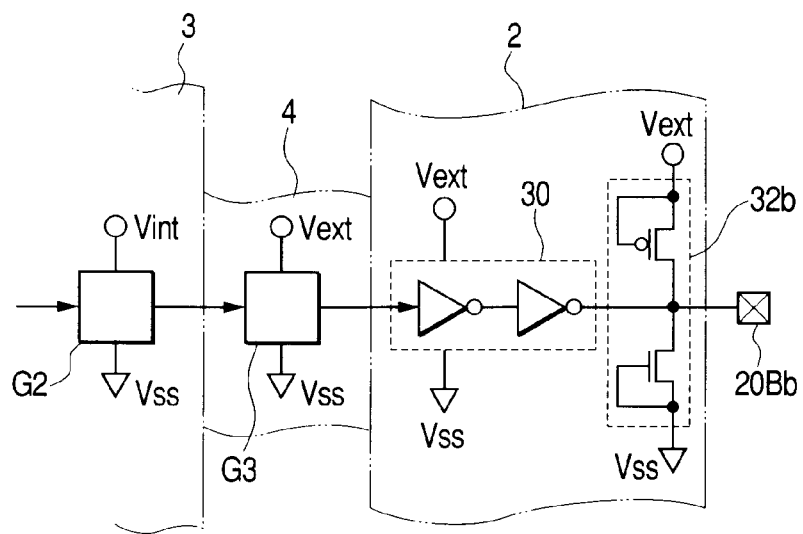
FIG. 12 is a schematic circuit diagram showing an embodiment of the signal output buffer and protective element connected to it.
Figure 13:
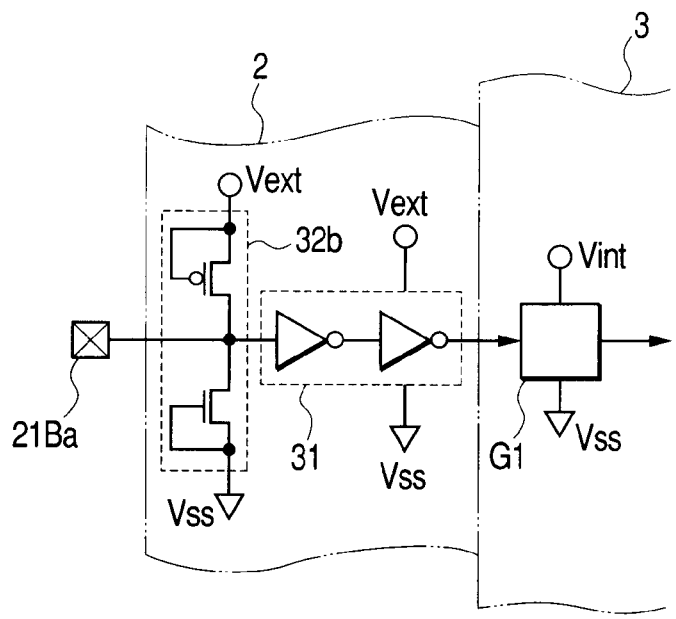
FIG. 13 is a schematic circuit diagram showing an embodiment of the signal input buffer and protective element connected to it.

An electrode pad 20Bb for an output signal is connected with a protective element 32b which is formed of a high-voltage p-channel MOS transistor and high-voltage n-channel MOS transistor in diode configuration as shown in FIG. 12 and FIG. 13 for example.

The second area 2 has the formation of main power lines (not shown) for the external power voltage Vext and ground voltage Vss, so that the input buffers 31, output buffers 30, etc. in the second area 2 are supplied with the operation voltage.

In regard to the signal transaction between a circuit operating based on the external power voltage Vext and a circuit operating based on the internal power voltage Vint, the former circuit can put the signal directly to the latter circuit as shown in FIG. 13 for example. Specifically, in the arrangement of FIG. 13, the gate circuit G1 operating on the internal power voltage Vint can receive directly the output of the input buffer 31.

Whereas, at the transfer of a signal from a circuit operating based on the internal power voltage Vint to a circuit operating based on the external power voltage Vext, the latter circuit receives a signal level lower than the power voltage, causing the CMOS input circuit, for example, to have an indeterminate logic level, resulting possibly in the creation of an undesired through-current.

With the intention of preventing such impropriety, there is formed in the fourth area 4 a level converting circuit G3 which converts the output signal of the gate circuit G2 operating based on the internal power voltage Vint in the third area 3 to have logic levels derived from the external power voltage Vext as shown in FIG. 12 for example. The signal having its logic levels converted by the level converting circuit G3 is put to the output buffer 30 in the second area 2 in the example of FIG. 12.

Figure 14:
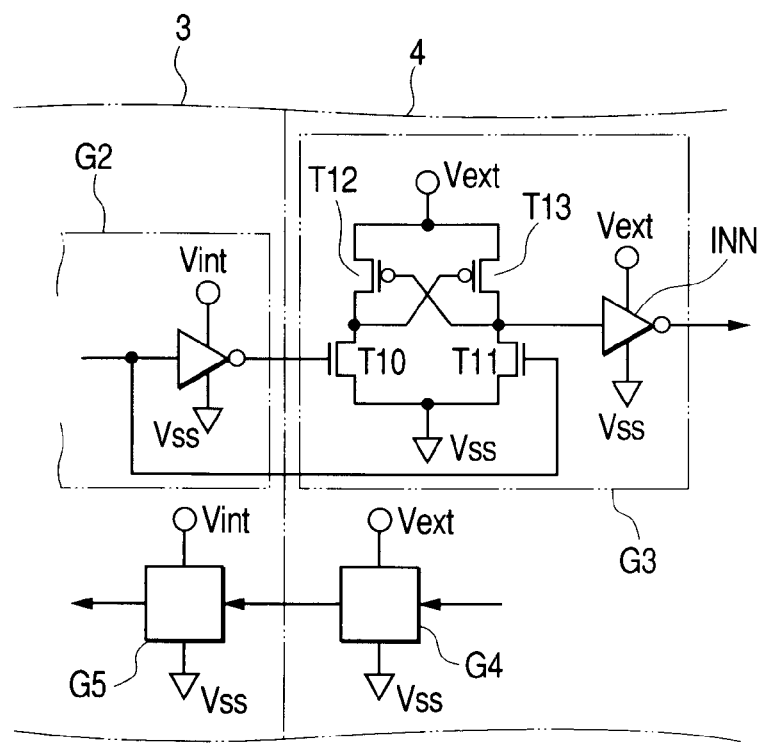
FIG. 14 is a schematic circuit diagram showing an embodiment of the signal level converting circuit and adjacent circuits.

FIG. 14 shows an embodiment of the level converting circuit G3. The level converting circuit G3 includes n-channel MOS transistors T10 and T11 which receive signals of complementary levels from the gate circuit G2 in the third area 3 and have their drains connected to the drains of loading p-channel MOS transistors T12 and T13, respectively, having their gates and drains connected crisscross, and the output signal on the common drains of the transistors T12 and T13 is amplified by an inverter (INV). Another gate circuit G4 in the fourth area 4 can have its output signal received directly by a gate circuit G5 in the third area 3.

Figure 15:
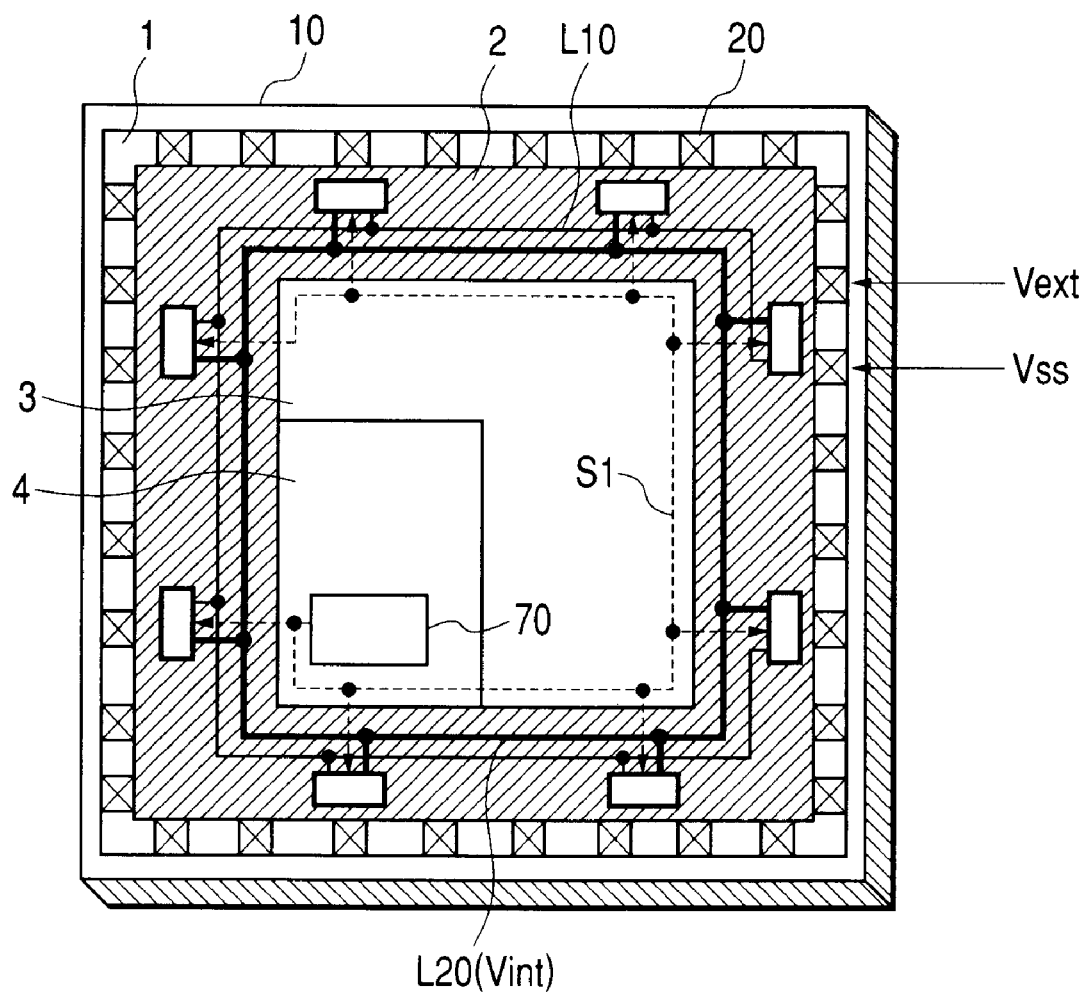
FIG. 15 is a diagram explaining an embodiment of the semiconductor integrated circuit having series regulators which do not need a reference voltage generation circuit.

FIG. 15 shows another embodiment of the semiconductor integrated circuit based on this invention. This semiconductor integrated circuit includes series regulators 150–157 each having the differential amplifier explained in connection with FIG. 3B, and accordingly it does not need to have the reference voltage generation circuit 60 in the fourth area 4.

Figure 16:
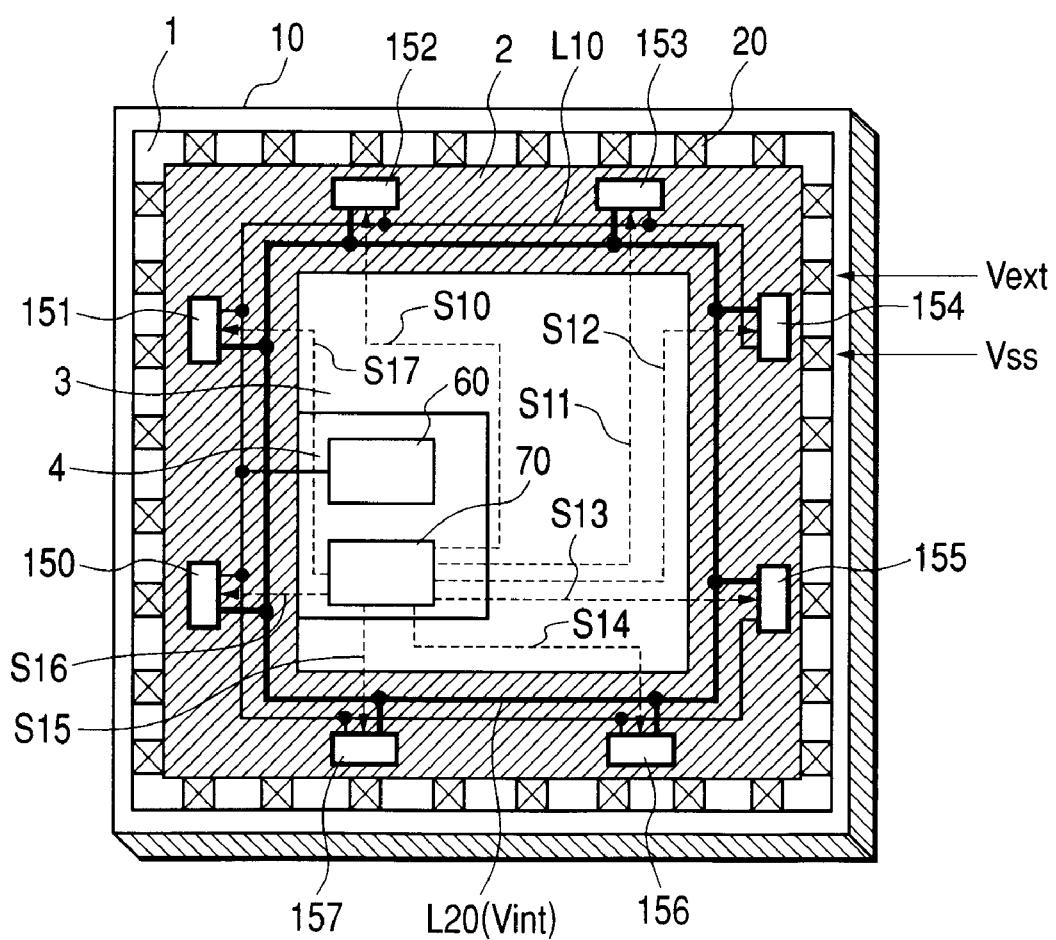
FIG. 16 is a diagram explaining an embodiment of the semiconductor integrated circuit which is designed to turn on or off a number of series regulators separately.

FIG. 16 shows still another embodiment of the inventive semiconductor integrated circuit. The control circuit 70 of this integrated circuit produces separate activate/deactivate signals S10–S17 for the series regulators 150–157 so that they can be turned on or off separately. The control circuit 70 turns on an arbitrary number of series regulators depending on the current capacity needed for the internal circuits in response to the external signal of mode setting, for example, thereby minimizing the power consumption. The remaining arrangement is identical to FIG. 1, and explanation is omitted.

Figure 17:
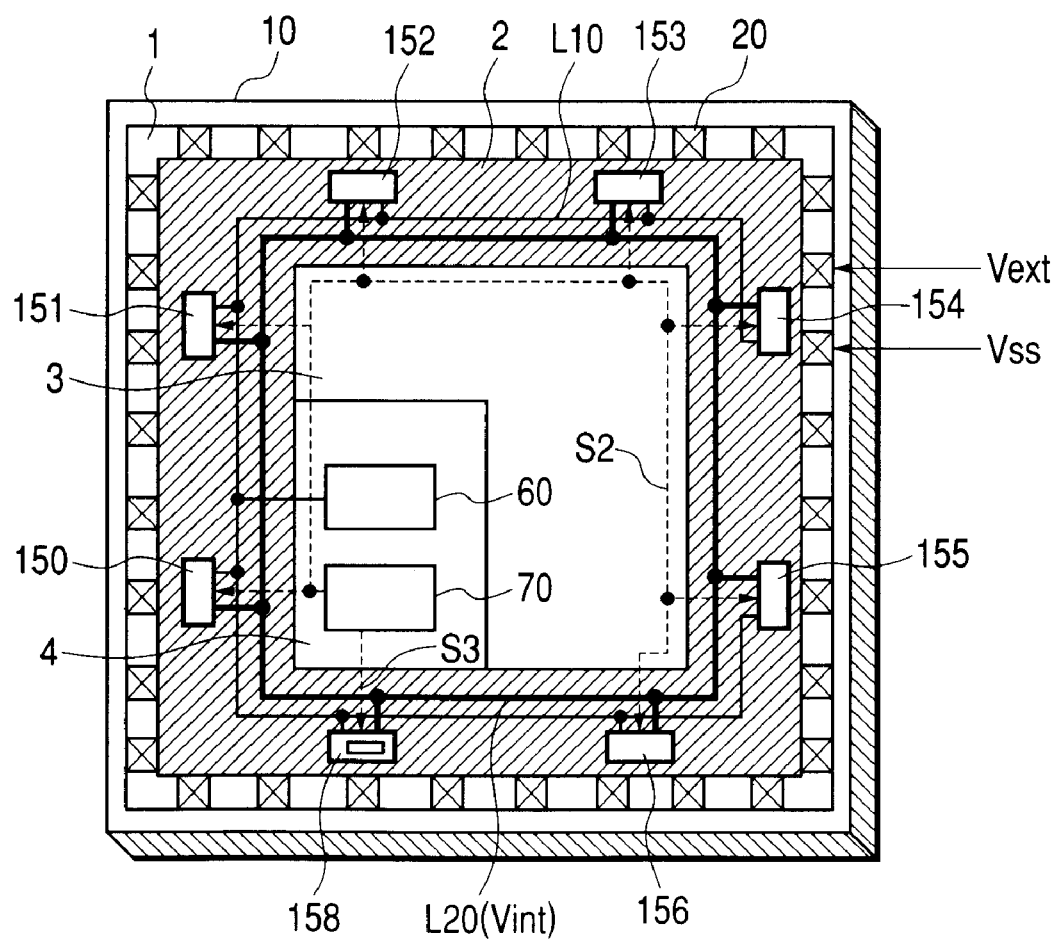
FIG. 17 is a diagram explaining an embodiment of the semiconductor integrated circuit having series regulators, of which one has a smaller power capacity than the rest.

FIG. 17 shows still another embodiment of the inventive semiconductor integrated circuit. This integrated circuit includes on a semiconductor chip 10 a number of series regulators 150–156 having an equal power capacity and another series regulator 158 having a smaller power capacity. The larger series regulators 150–156 are turned on or off together by a control signal S2, whereas the smaller series regulator 158 is turned on or off by another control signal S3. The control circuit 70 turns on only the larger series regulators 150–156 or all series regulators 150–157 when the demand of current supply is large. It turns on only the smaller series regulator 158 when the demand of current supply is small. In consequence, the semiconductor integrated circuit can turn on the series regulator 158 and turns off the other series regulators 150–156 in the standby mode of the semiconductor integrated circuit set by the external signal, for example, thereby fostering the power conservation.

Figure 18:
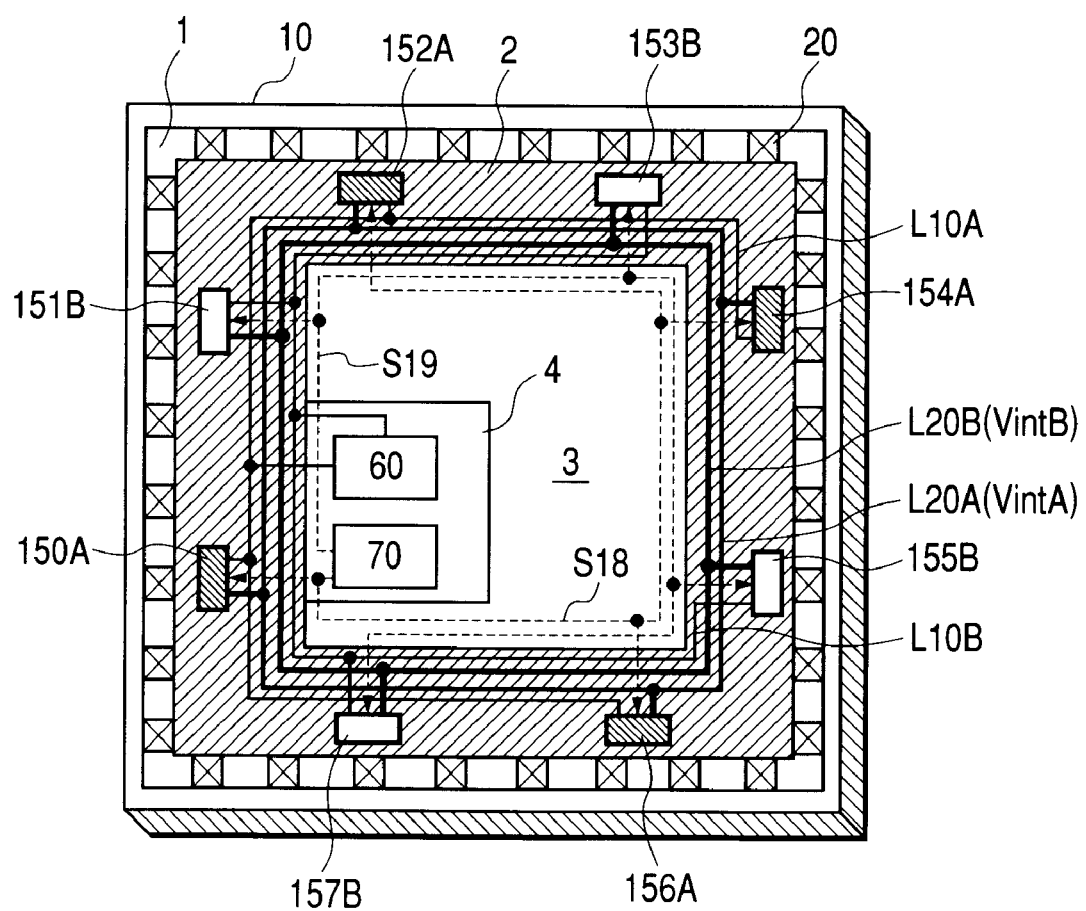
FIG. 18 is a diagram explaining an embodiment of the semiconductor integrated circuit which is designed to use several kinds of internal power voltages.

FIG. 18 shows still another embodiment of the inventive semiconductor integrated circuit. This integrated circuit has several different power voltages, e.g., VintA and VintB, supplied to the internal circuits in the third area 3 on the semiconductor chip 10. Series regulators for producing these voltages VintA and VintB are grouped into A and B. Specifically, for example, series regulators 150A, 152A, 154A and 156A for producing the voltage VintA have a same power capacity, while series regulators 151B, 153B, 155B and 157B for producing the voltage VintB have a power capacity which is same as or different from that of the A-group regulators.

The A-group regulators 150A, 152A, 154A and 156A use a reference voltage line L10A and main power line L20A, while the B-group regulators 151B, 153B, 155B and 157B use a reference voltage line L10B and main power line L20B. These series regulators are turned on or off together on a group basis. For example, the A-group regulators 150A, 152A, 154A and 156A are controlled by a control signal S18, while the B-group regulators 151B, 153B, 155B and 157B are controlled by another control signal S19. In consequence, it becomes possible for the semiconductor integrated circuit 10 to include internal circuits operating based on different internal power voltages. The remaining arrangement is identical to FIG. 1, and explanation is omitted.

Figure 19:
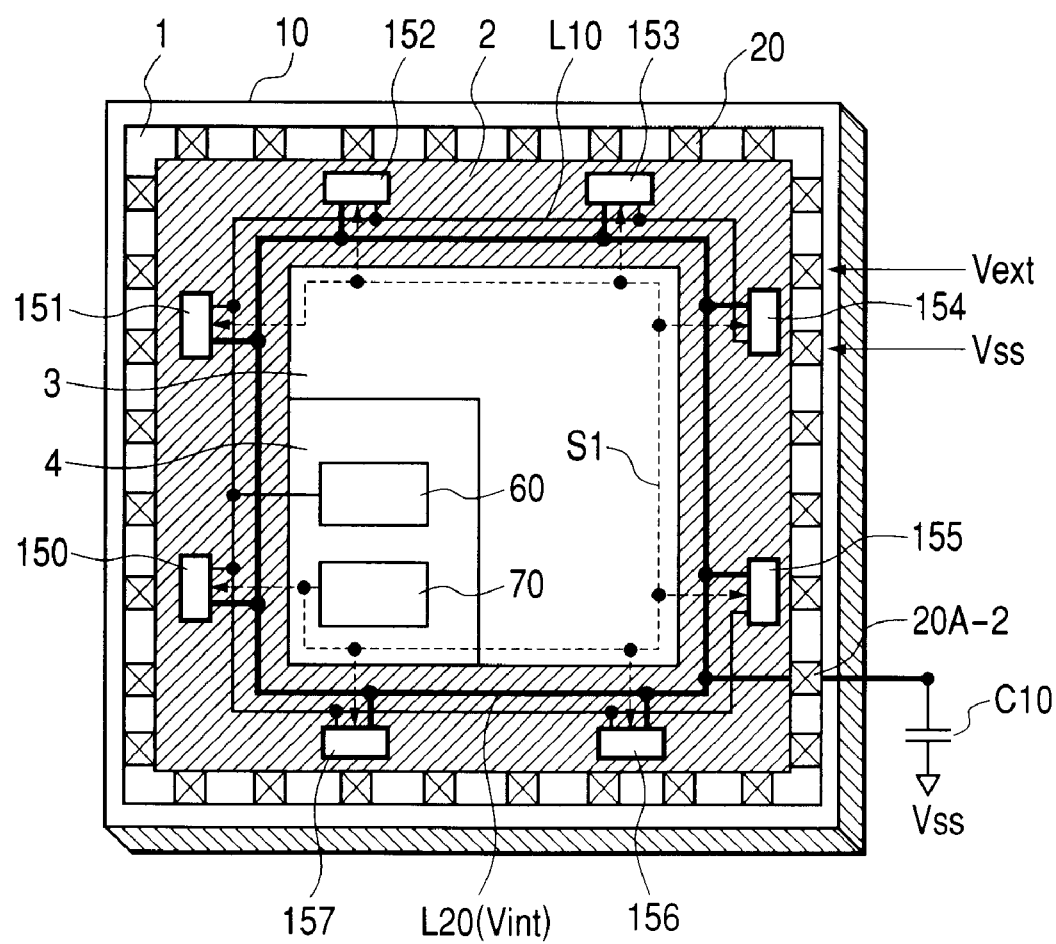
FIG. 19 is a diagram explaining an embodiment of the semiconductor integrated circuit which can have a stabilizing capacitor attached externally to the semiconductor chip through an electrode pad.

FIG. 19 shows still another embodiment of the inventive semiconductor integrated circuit. The circuit has its main power line L20 connected via a pad 20A-2 out of the electrode pads 20 in the first area 1 to a stabilizing capacitor C10 which is attached externally to the semiconductor chip 10. This power line system minimizes the fluctuation and fall of the internal power voltage Vint on the main power line L20. The remaining arrangement is identical to FIG. 1, and explanation is omitted.

Figure 20:
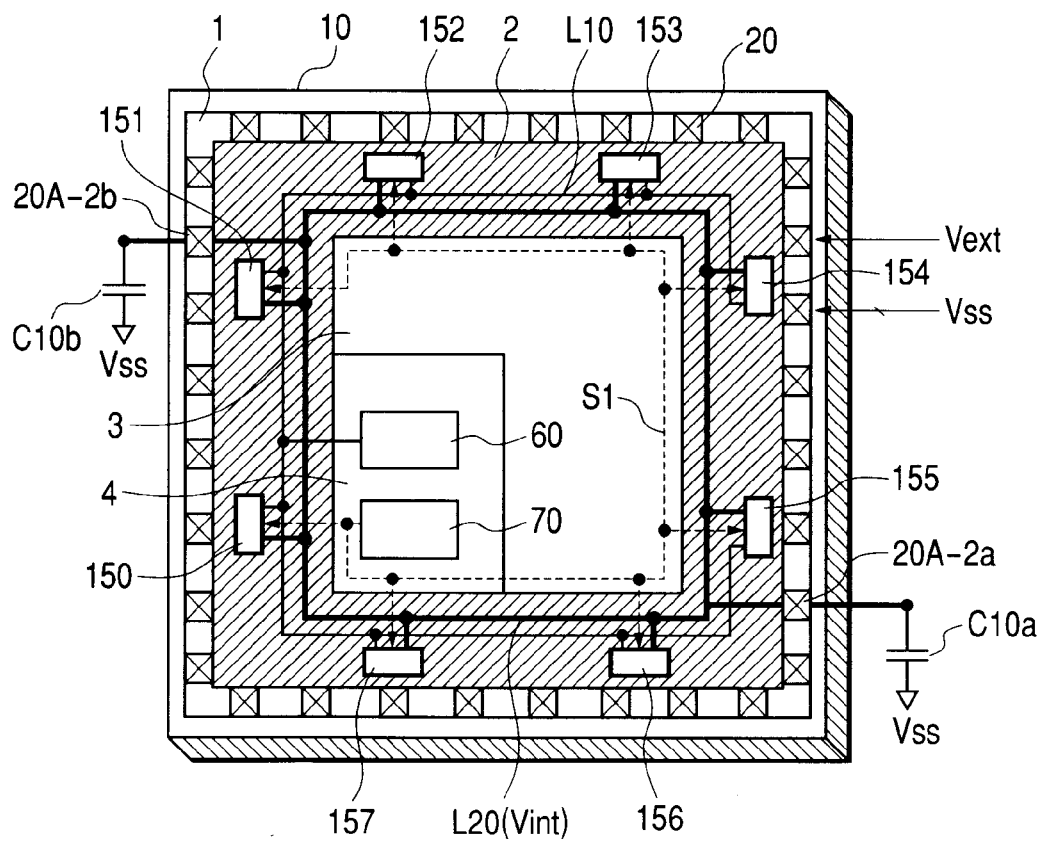
FIG. 20 is a diagram explaining an embodiment of the semiconductor integrated circuit which can have multiple stabilizing capacitors attached externally to the semiconductor chip through electrode pads.

FIG. 20 shows still another embodiment of the inventive semiconductor integrated circuit. The circuit has its main power line L20 connected via multiple pads, e.g., 20A-2a and 20A-2b, out of the electrode pads 20 in the first area 1 to stabilizing capacitors C10a and C10b which are attached externally to the semiconductor chip 10. This power line system is capable of further stabilizing the internal power voltage Vint.

Figure 21:
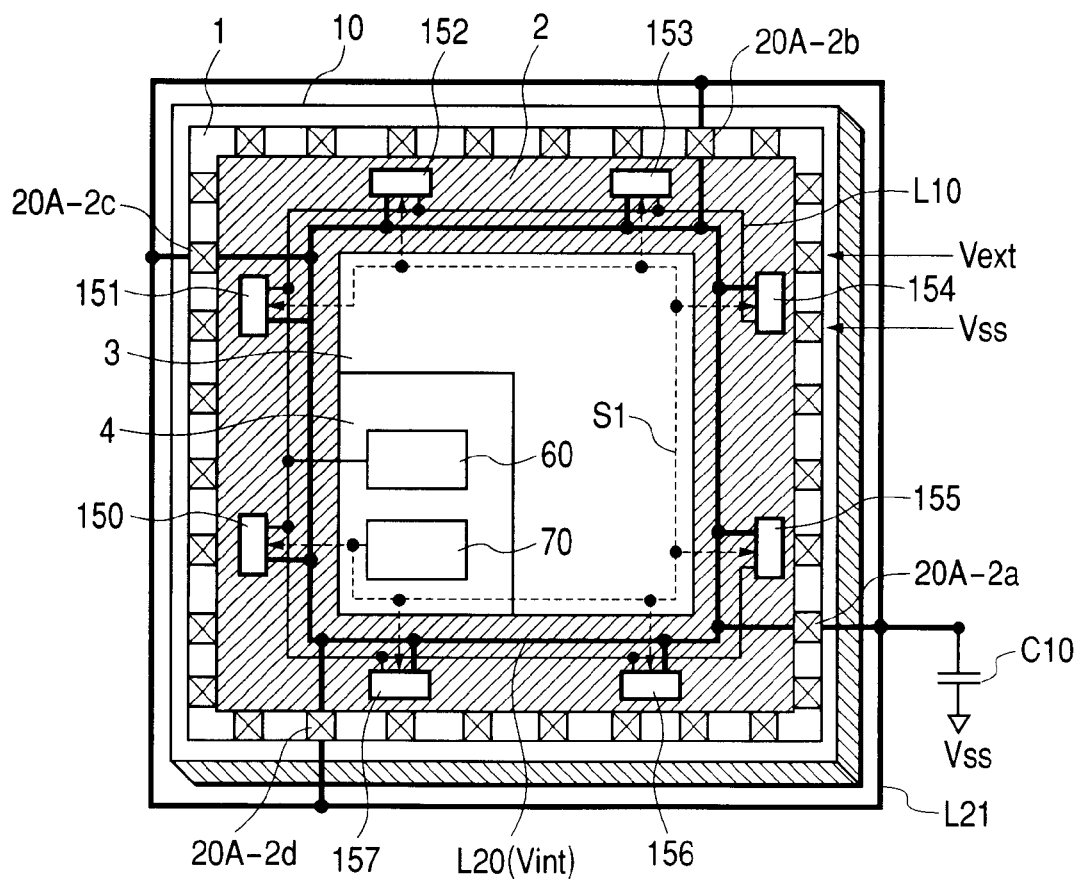
FIG. 21 is a diagram explaining an embodiment of the semiconductor integrated circuit which is designed to have an additional main power line for the internal power voltage running round on the semiconductor chip.

FIG. 21 shows still another embodiment of the inventive semiconductor integrated circuit. This integrated circuit is designed to have another main power line L21 for the internal power voltage Vint running round on the semiconductor chip 10 in addition to the main power line L20. The main power line L21 is connected to the main power line L20 via multiple pads, e.g., 20A-2a, 20A-2b, 20A-2c and 20A-2d, out of the electrode pads 20 in the first area 1. The main power line L21 is connected with at least one stabilizing capacitor C10. The main power line L21 is formed inside the package of the integrated circuit or formed on a printed circuit board where the integrated circuit is mounted. This power line system is capable of further stabilizing the internal power voltage Vint.

Figures 22, 23:
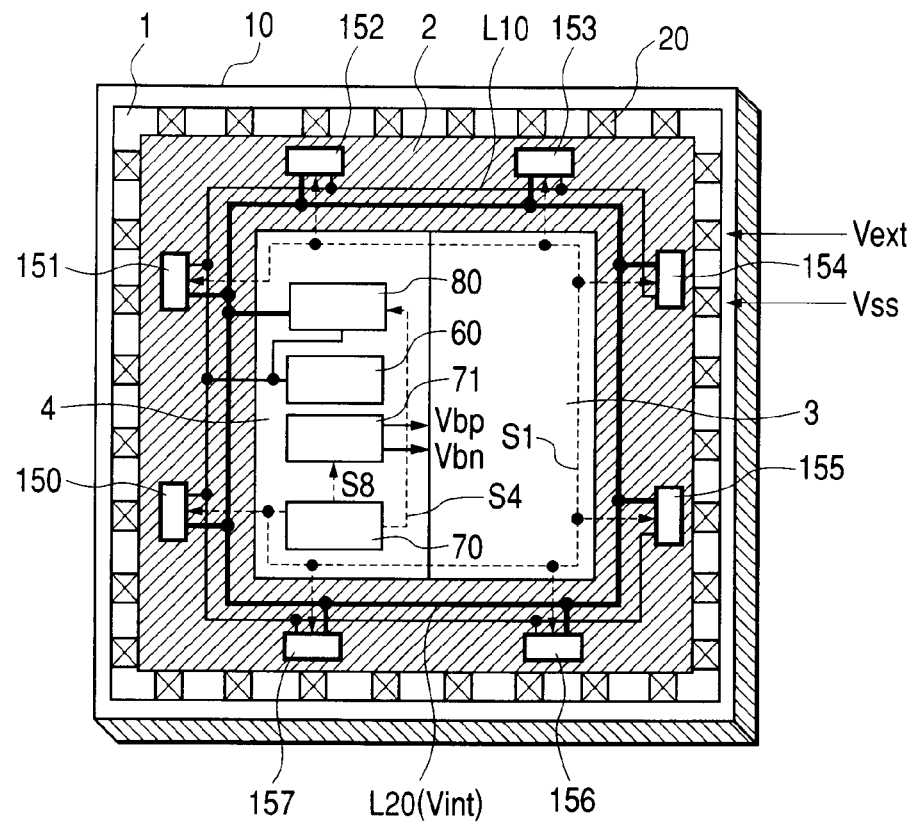
FIG. 22 is a diagram explaining an embodiment of the semiconductor integrated circuit having a sub series regulator and a substrate bias control circuit.
FIG. 23 is a table listing an embodiment of the operation modes and the corresponding active/inactive states of the functional circuits of the semiconductor integrated circuit.

FIG. 22 shows still another embodiment of the inventive semiconductor integrated circuit. This integrated circuit is derived from the circuit of FIG. 1, with a sub series regulator 80 which consumes less power and a substrate bias control circuit 71 for the third area 3 being laid additionally in the fourth area 4. The sub series regulator 80 has its voltage output terminal connected to the main power line L20. The substrate bias control circuit 71 produces a substrate voltage Vbp for p-channel MOS transistors and a substrate voltage Vbn for n-channel MOS transistors. The substrate voltages, except for that of the third area 3, are the power voltage for the p-channel MOS transistors and the ground voltage for the n-channel MOS transistors, although this affair is not compulsory.

The semiconductor integrated circuit of FIG. 22 has, for example, four operation modes of active mode, standby mode, data hold mode (sleep mode) and shut-down mode as listed in the table of FIG. 23, although this affair is not compulsory.

The active mode enables the semiconductor integrated circuit to operate at its highest level of performance. In this mode, the reference voltage generation circuit 60 and series regulators 150–157 are turned on, and the sub series regulator 80 and substrate bias control circuit 71 are turned off. Consequently, the third area 3 has its substrate voltages established to be the internal power voltage Vint for the p-channel MOS transistors and the ground voltage Vss for the n-channel MOS transistors for example.

The standby mode is the power conservation mode, in which the semiconductor integrated circuit can respond only to limited access events such as interrupts. In this mode, the reference voltage generation circuit 60 and sub series regulator 80 are turned on, and the series regulators 150–157 are turned off. Based on the switching of the series regulators, their internal power consumption can be reduced. The substrate bias control circuit 71 is turned on to supply the substrate voltages Vbp and Vbn to the internal circuits of the third area 3. For the purpose of power conservation, the substrate bias control takes place to provide a reverse substrate bias so that the MOS transistors have a higher threshold voltage. Specifically, for example, the circuit 71 releases the external power voltage Vext for the substrate voltage Vbp of the p-channel MOS transistors and the ground voltage Vss for the substrate voltage Vbn of the n-channel MOS transistors. Negative voltages are produced by a charge pump circuit in the substrate bias control circuit 71 for example. In consequence, the sub-threshold leak current of the internal circuits in the third area 3 can be reduced in the standby mode.

The data hold mode causes the semiconductor integrated circuit to have a static internal state. In this mode, the internal power voltage Vint is lowered in addition to the switching of series regulators for the standby mode, and the sub-threshold leak current can further be reduced.

Figure 24:
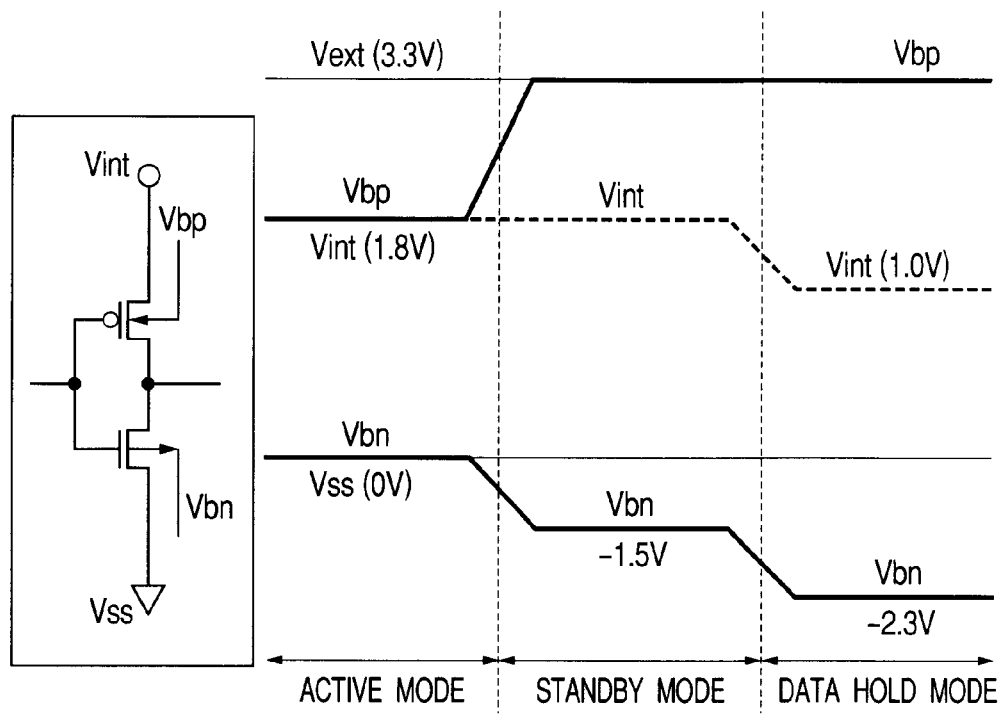
FIG. 24 is a diagram explaining an embodiment of substrate bias control in the operation modes of the semiconductor integrated circuit.

FIG. 24 shows the internal power voltage Vint and substrate voltages Vbp and Vbn during the transition of operation mode from the active mode to the standby mode and to the data hold mode. For internal circuits of the third area 3, e.g., CMOS inverters, their supplied internal power voltage Vint and substrate voltages Vbp and Vbn for p-channel and n-channel MOS transistors are varied as shown in FIG. 24. In the active mode, the substrate voltages Vbp and Vbn are pulled to the internal power voltage Vint and ground voltage Vss, respectively, so that MOS transistors have no substrate bias. In the standby mode, the Vbp is pulled to the external power voltage Vext and the Vbn is pulled to a negative voltage such as −1.5 V. In the data hold mode, the internal power voltage Vint is lowered and, at the same time, the substrate voltage Vbn for the n-channel MOS transistors is lowered to a negative voltage such as −2.3 V. In the substrate voltage control which is responsive to the operation mode of the semiconductor integrated circuit, the positive forward bias voltage is available by the intact external power voltage Vext, and only the negative bias voltages are produced by the charge pump circuit. Accordingly, the semiconductor integrated circuit does not need to be supplied from the outside with special voltages for the substrate voltage control.

Figure 25:
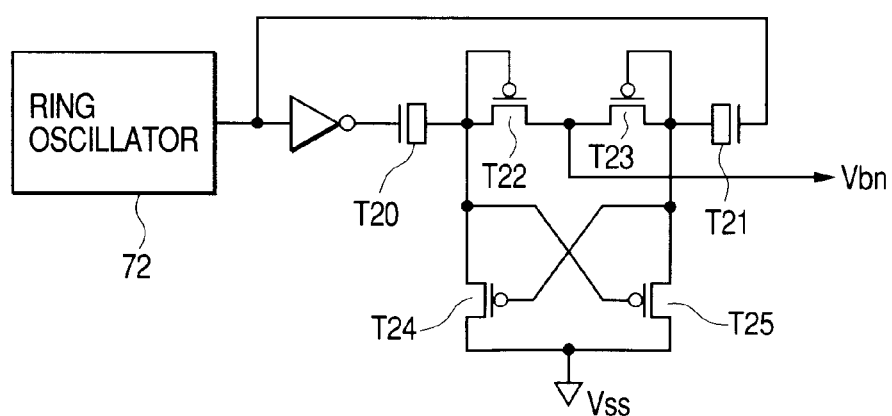
FIG. 25 is a schematic circuit diagram showing an embodiment of the charge pump circuit.

The negative bias voltages can be produced by a charge pump circuit as shown in FIG. 25. The circuit has its ring oscillator 72 operated to feed clock signals of opposite phases to the gates of MOS capacitors T20 and T21, and p-channel MOS transistors T22–T25 operate in synchronism with the clock signals to pump charges in the capacitors, thereby producing a negative voltage on the node of the transistors T22 and T23. The produced negative voltage can be as low as −Vint+Vth1+Vth2 (Vth1 and Vth2 are threshold voltages of T22 and T23). For producing more than one negative voltage depending on the operation mode, the oscillation frequency of the ring oscillator 72 is controlled based on the negative feedback of the output voltage so that the intended voltage is maintained. In consequence, the negative substrate voltages Vbn of −1.5 V and −2.3 V for the standby mode and data hold mode, respectively, shown in FIG. 24 are obtained.

The shut-down mode causes the semiconductor integrated circuit to turn off the reference voltage generation circuit 60, series regulators 150–157, sub series regulator 80 and substrate bias control circuit 71. The series regulators 150–157 are turned on or off by the control signal S1, the sub series regulator 80 is turned on or off by the control signal S4, and the substrate bias control circuit 71 is turned on or off by the control signal S8.

Figure 26:
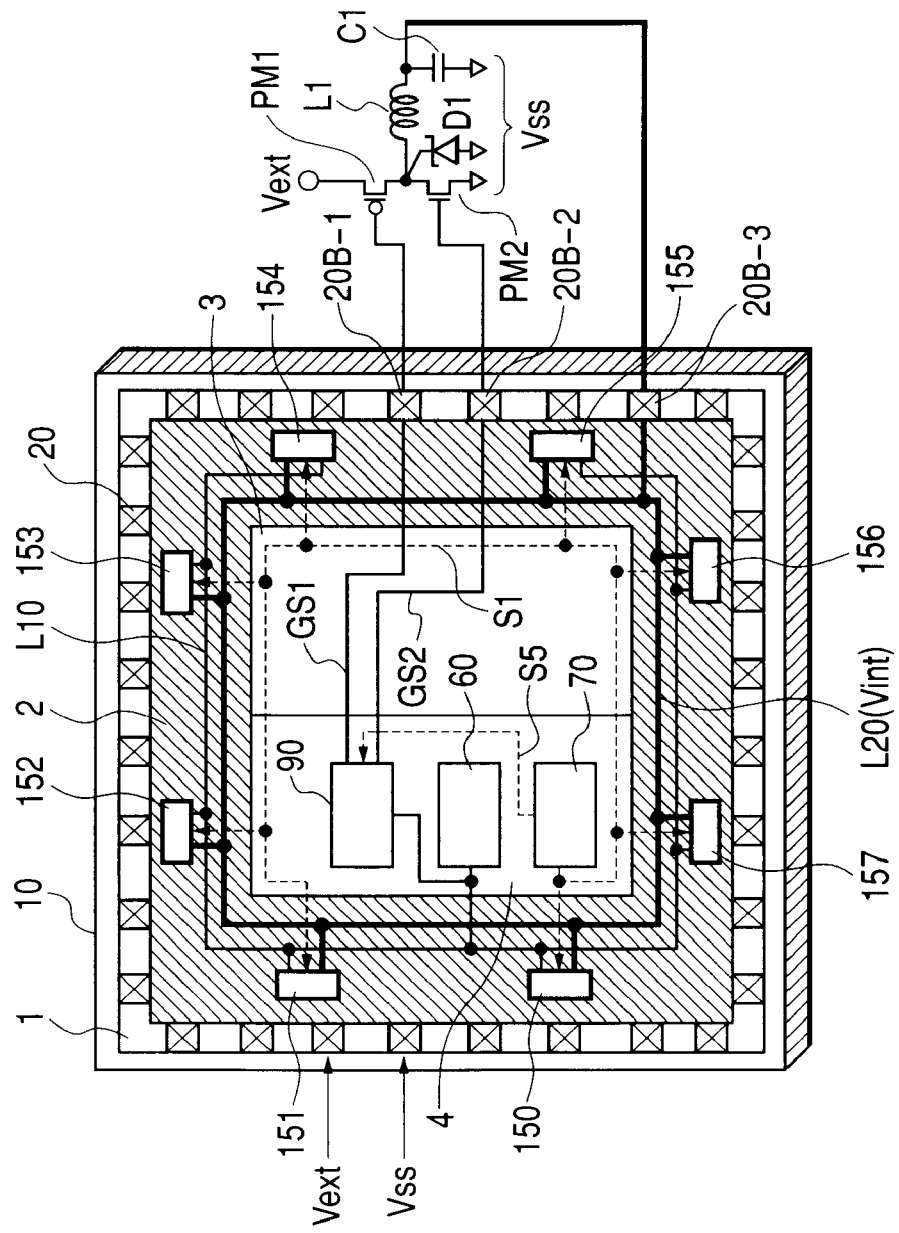
FIG. 26 is a diagram showing an embodiment of the semiconductor integrated circuit having an on-chip driver control circuit for an external switching regulator.

FIG. 26 shows still another embodiment of the inventive semiconductor integrated circuit. This semiconductor integrated circuit differs from the circuit of FIG. 1 in the additional layout of a switching regulator driver control circuit 90 in the fourth area 4 on the semiconductor chip 10. The driver control circuit 90 is designed to act on a device which is attached externally to the semiconductor chip 10, e.g., driving power MOS transistors PM1 and PM2, by which a rectangular voltage wave is produced from the external power voltage Vext and processed by a low-pass filter circuit made up of an inductance L1, capacitor C1 and Schottky diode D1 for example, by which the internal power voltage Vint to be supplied to the internal circuits of the third area 3 is produced.

Based on the provision of only the driver control circuit 90 on the semiconductor chip 10, with other large switching regulator parts including the driving MOS transistors being attached externally, this semiconductor integrated circuit allows the selective use of the internal series regulators 150–157 or the external switching regulator without taking up a significant overhead chip area.

Moreover, the external attachment of the driving MOS transistors avoids the problem of on-chip driving MOS transistors, in which case there must be increased numbers of power voltage pads for Vext, Vint and Vss in proportion to an increased power supply to the internal circuits. In the arrangement of FIG. 26, electrode pads 20B-1 and 20B-2 are used for the output of the switching control signals GS1 and GS2 to the driving MOS transistors and another electrode pad 20B-3 is used for the input of the internal power voltage Vint produced by the external switching regulator.

The series regulators 150–157 and driver control circuit 90 are turned on or off by the control circuit 70 by using the control signals S1 and S5. However, this semiconductor integrated circuit is operated by use of only one of the power sources, and therefore one of the control signals S1 and S5 may be deactivated permanently by means of an electric fuse program circuit, laser fuse program circuit or flash memory fuse using a nonvolatile memory cell.

Figure 27:
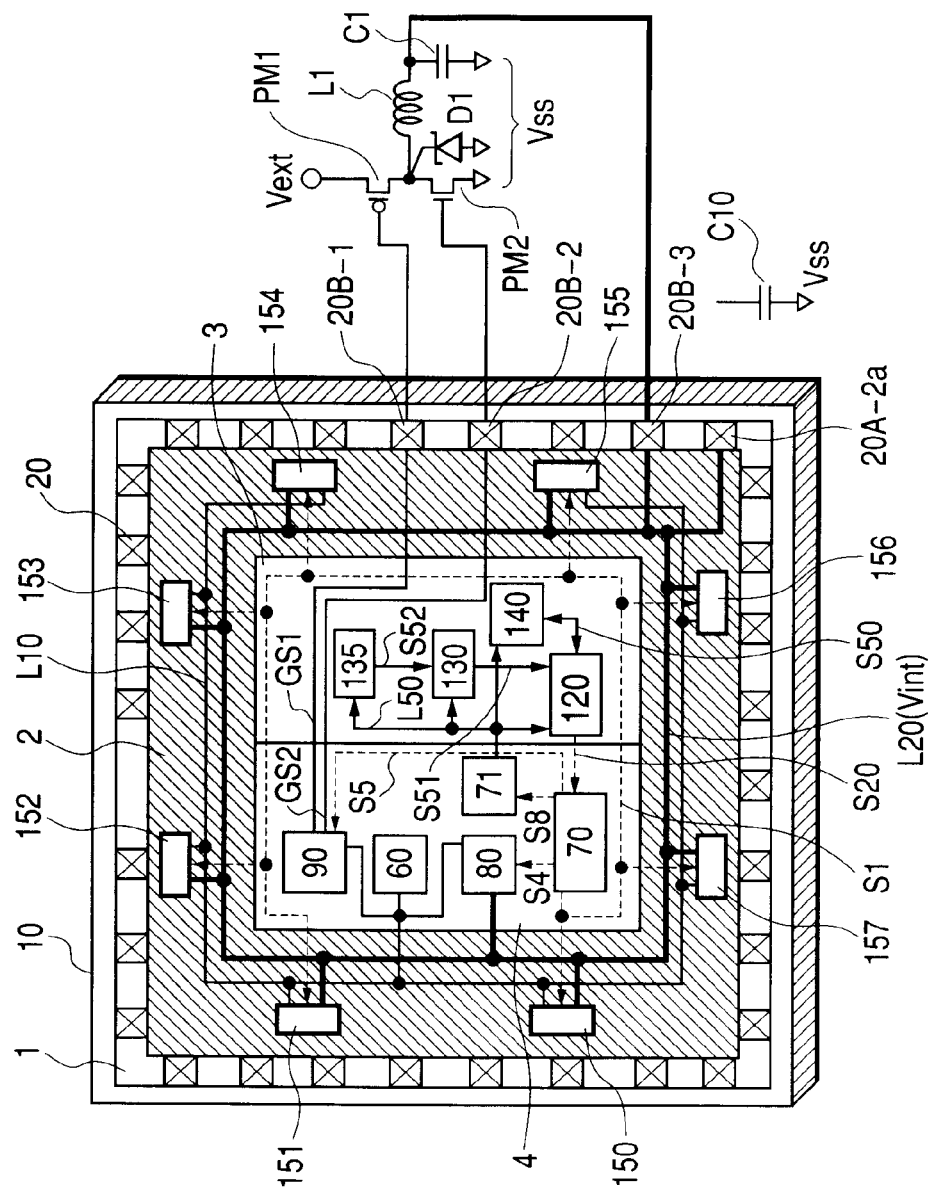
FIG. 27 is a diagram showing an embodiment of the semiconductor integrated circuit which has both circuit arrangements shown in FIG. 22 and FIG. 26.

FIG. 27 shows still another embodiment of the inventive semiconductor integrated circuit. This semiconductor integrated circuit results from combining the circuits of FIG. 22 and FIG. 26. The semiconductor chip 10 includes the sub series regulator 80 used in the standby mode and the substrate bias control circuit 71 and switching regulator driver control circuit 90. Further shown in this figure as specific examples of internal circuits in the third area 3 are a CPU 120, a nonvolatile memory 135 and peripheral circuits 140. The nonvolatile memory 135 is an electric fuse, flash memory, etc. S50 represents the signals transacted between the peripheral circuits 140 and CPU 120, S51 represents the output signals of the register, S52 represents the output signal of the nonvolatile memory 135, and S20 represents the output signal of the CPU to the control circuit 70. L50 represents the supply lines of the substrate voltages Vbp and Vbn released by the substrate bias control circuit 71.

The embodiment of FIG. 27 selects the use of the switching regulator instead of the internal series regulators 150–157 and 80. In the case of using the series regulators 150–157 and 80, the wiring from the electrode pads 20B-1 and 20B-2 to the external power MOS transistors PM1 and PM2 is removed and the external stabilizing capacitor C10 is connected to the pad 20A-2a.

Figure 28:
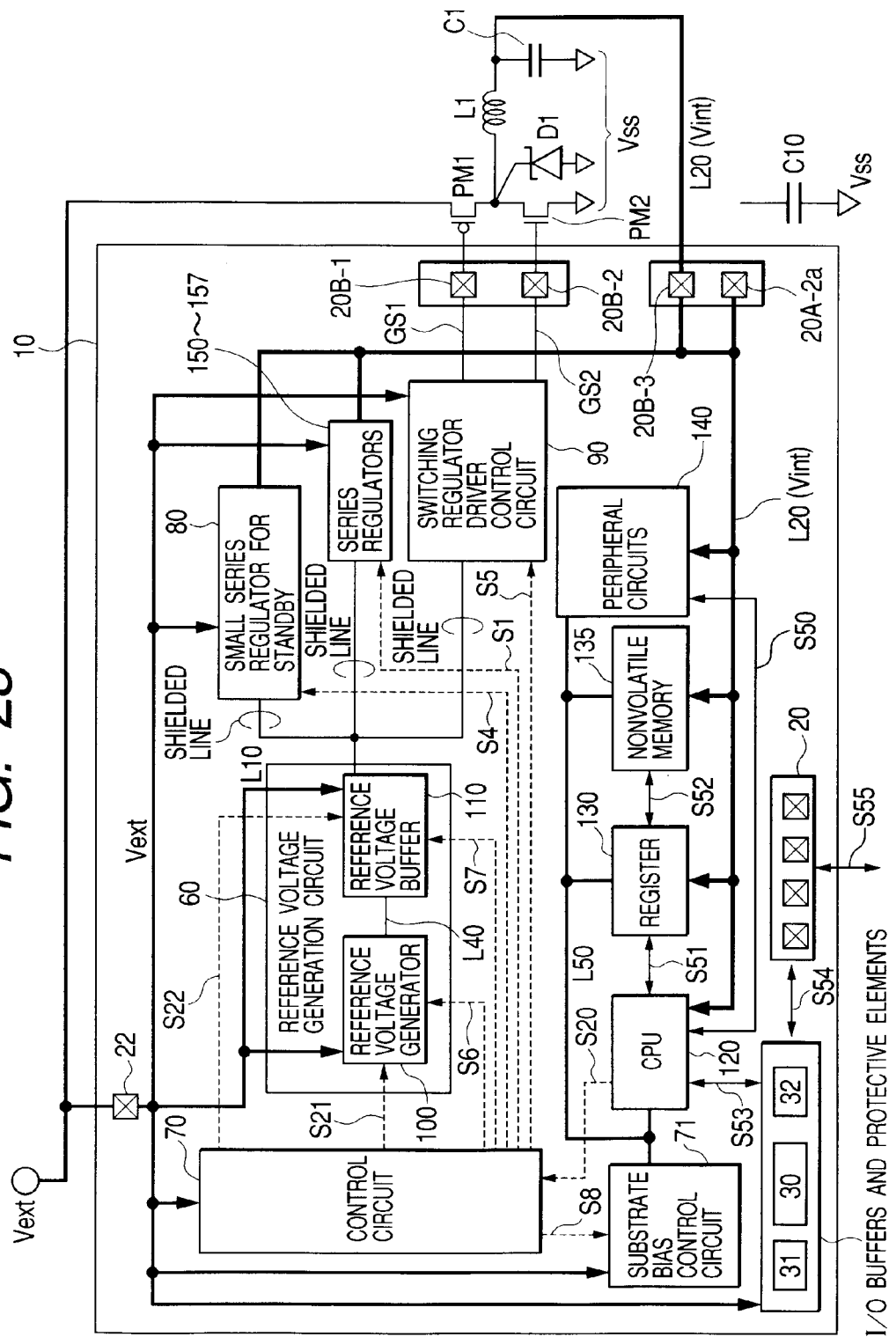
FIG. 28 is a block diagram showing mainly the connection of the signal and power lines among the functional circuits of the semiconductor integrated circuit shown in FIG. 27.

FIG. 28 shows mainly the signal and power line connection of the arrangement of FIG. 27. The reference voltage generation circuit 60 shown by being split into a reference voltage generator 100 and a reference voltage buffer 110. Circuits operating based on the external power voltage Vext include the control circuit 70, substrate bias control circuit 71, reference voltage generator 100, reference voltage buffer 110, small series regulator 80 for standby mode, series regulators 150–157, input/output buffers 30 and 31, protective elements 32, and switching regulator driver control circuit 90. Circuits operating based on the internal power voltage Vint include the CPU 120, register 130, nonvolatile memory 135, and peripheral circuits 140.

The control signal S1 turns on or off the series regulators 150–157, the control signal S4 turns on or off the sub series regulator 80 for standby mode, and the control signal S5 turns on or off the switching regulator driver control circuit 90. The control signal S6 turns on or off the reference voltage generator 100, the control signal S7 turns on or off the reference voltage buffer 110, and the control signal S8 turns on or off the substrate bias control circuit 71. The control signal S20 given by the CPU 120 controls the control circuit 70, the control signal S21 switches the output voltage of the reference voltage generator 100, and the control signal S22 switches the output voltage of the reference voltage buffer 110. S53 represents the input/output signals transacted between the CPU 120 and the buffers 30 and 31.

Figure 29:
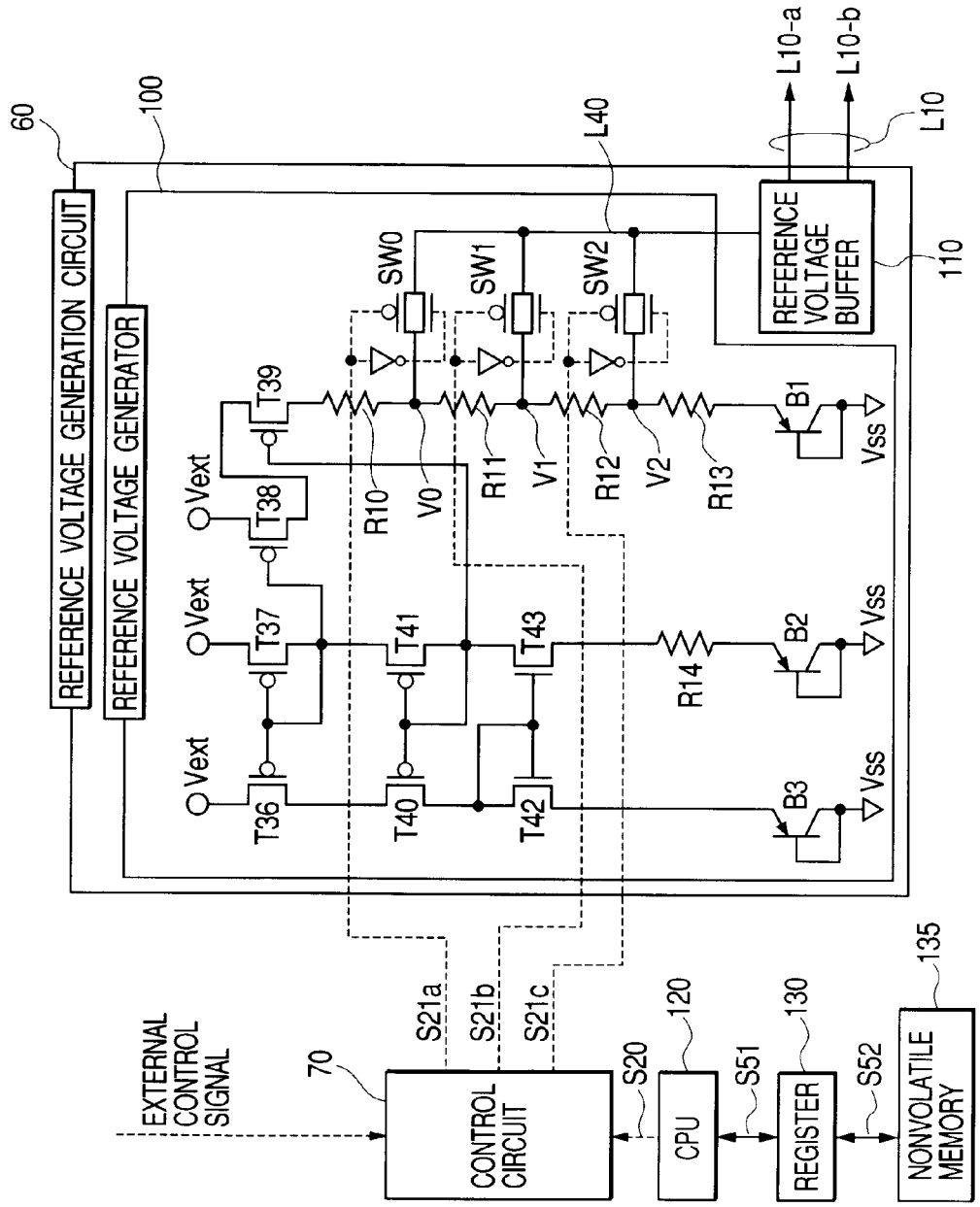
FIG. 29 is a schematic circuit diagram showing an embodiment of the reference voltage generator and the associated circuit for setting up the trimming information.

FIG. 29 shows a specific circuit arrangement of the reference voltage generator 100 and the associated trimming information setting circuit. This reference voltage generator 100 employs a band gap reference circuit, which uses bipolar transistors B2 and B3 of different Vbe and operates to conduct a certain amount of current through MOS transistors T38 and T39, resistors R10, R11 and R12, and bipolar transistor B1 such that the difference of Vbe is compensated based on the current and a resistor R14, thereby producing the reference voltage. Pairs of MOS transistors R36 and R37, R40 and R41, and R42 and R43 form current mirror loads. This reference voltage generator 100 has the ability of output trimming for the cancellation of disparity of part characteristics based on the selective tapping of output voltage with CMOS transfer gates SW0–SW2, which is controlled by the control circuit 70 through the selection signals s21a, s21b and s21c. Trimming information for tap selection is held by the nonvolatile memory 135. At the initializing process, for example, the control signal S52 reads the trimming information out of the nonvolatile memory 135 and loads into the register 130, and the control signal S51 transfers the contents of the register 130 to the control circuit 70 to establish the output reference voltage.

The reference voltage trimming operation will be explained in more detail. Before the output reference voltage is established, only the switch SW1 is turned on by the signal S21b to release output voltage V1. This voltage V1 is fed to the reference voltage buffer 110. The reference voltage generator 100 has a theoretical output voltage defined to be the standard voltage at which it operates at a minimal dependency on temperature. In one case if the voltage V1 is higher than the standard voltage due to the part disparity or the like, an external control signal acts on the control circuit 70 to release a control signal S21c, by which only the switch SW2 is turned on to tap another voltage V2 which is lower than V1. In another case if the voltage V1 is lower than the standard voltage due to the part disparity or the like, the external control signal acts on the control circuit 70 to release another control signal S21a, by which only the switch SW0 is turned on to tap another voltage V0 which is higher than V1. The switch selection data is stored in the nonvolatile memory 135. When the semiconductor integrated circuit is turned on next, the switch selection data is read out of the nonvolatile memory 135 into the register 130, causing the control circuit 70 to release the control signal to turn on the selected one of the switches SW0–SW2.

Figure 30:
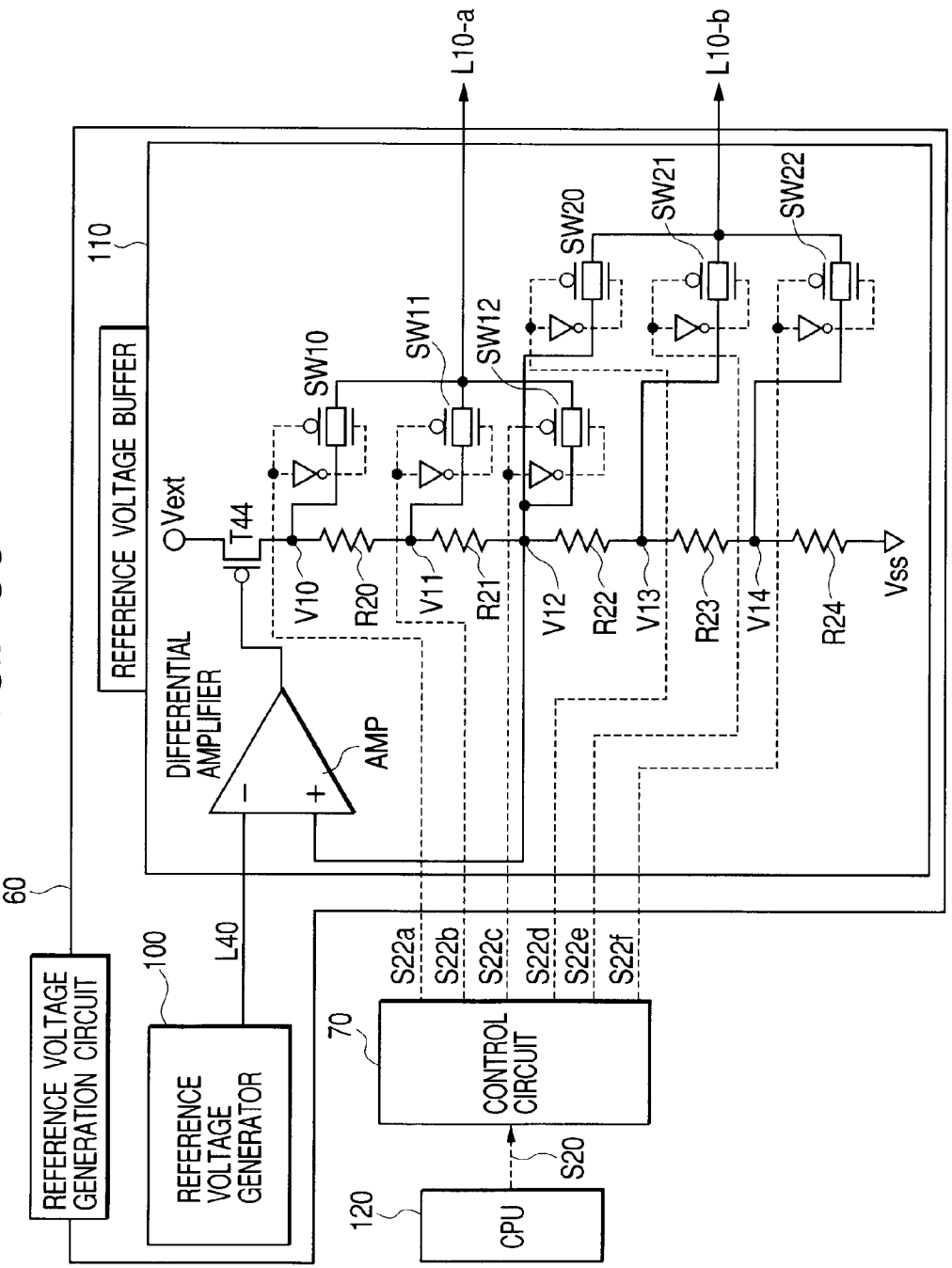
FIG. 30 is a schematic circuit diagram showing an embodiment of the arrangement for switching the internal power voltage by using the reference voltage buffer in response to the operation frequency of the internal circuits which are laid in the third area.

FIG. 30 shows an embodiment of the circuit arrangement for switching the internal power voltage Vint based on the operation of the reference voltage buffer 110 depending on the operation frequency of the internal circuits in the third area 3.

The reference voltage buffer 110 includes a voltage dividing circuit made up of a p-channel MOS transistor T44 and resistors R20–R24 all connected in series and a differential amplifier (AMP). The differential amplifier AMP amplifies the difference of the voltage on the node V12 of the voltage dividing circuit from the output voltage of the reference voltage generator 100, thereby controlling the conductivity of the MOS transistor T44.

One of the voltages on the voltage dividing nodes V10, V11 and V12 of the voltage dividing circuit is conducted to a voltage line L10-a by being selected by switches SW10, SW11 and SW12, and one of the voltages on the voltage dividing nodes V12, V21 and V22 is conducted to a voltage line L10-*b* by being selected by switches SW20, SW21 and SW22. The switches SW10–SW12 and SW20–SW22 are operated by selection control signals S22*a*–S22*f* which are released by the control circuit 70 under control of the CPU 120. Namely, the reference voltage line L10 is split into the L10-*a* and L10-*b* in this embodiment.

The output voltages of the reference voltage generation circuit 60 are used for the standard voltage of the series regulators 150–157 and sub series regulator 80 and the standard voltage of the switching regulator driver control circuit 90. Specifically, for example, the voltage on the voltage line L10-*a* is for the series regulators, and the voltage on the voltage line L10-*b* is for the driver control circuit, although this affair is not compulsory. The series regulators and switching regulator have their output voltages varied in response to the voltages on the voltage lines L10-*a* and L10-*b*.

Specifically, for example, before the reference voltage buffer 110 implements the voltage control, the switch SW11 is turned on by the control signal S22*b* to release the output voltage V11 on the line L10-*a*. At the same time, the switch SW21 is turned on by the control signal S22*e* to release the output voltage V13 on the line L10-*b*.

For the low-speed operation of the CPU 120, the control signals S22*c* and S22*f* turn on the switches SW12 and SW22 to switch the output voltage on the line L11 to V12 which is lower than V11 and the output voltage on the line 12 to V14 which is lower than V13. For the high-speed operation of the CPU 120, the control signals S22*a* and S22*d* turn on the switches SW10 and SW20 to switch the output voltage on the line L11 to V12 which is higher than V11 and the output voltage on the line L12 to V12 which is higher lower than V13. In this manner, the semiconductor integrated circuit can operate by expending power which matches with the operational speed of the CPU 120. It is obviously possible to provide more taps for output voltage selection.

Figure 31:
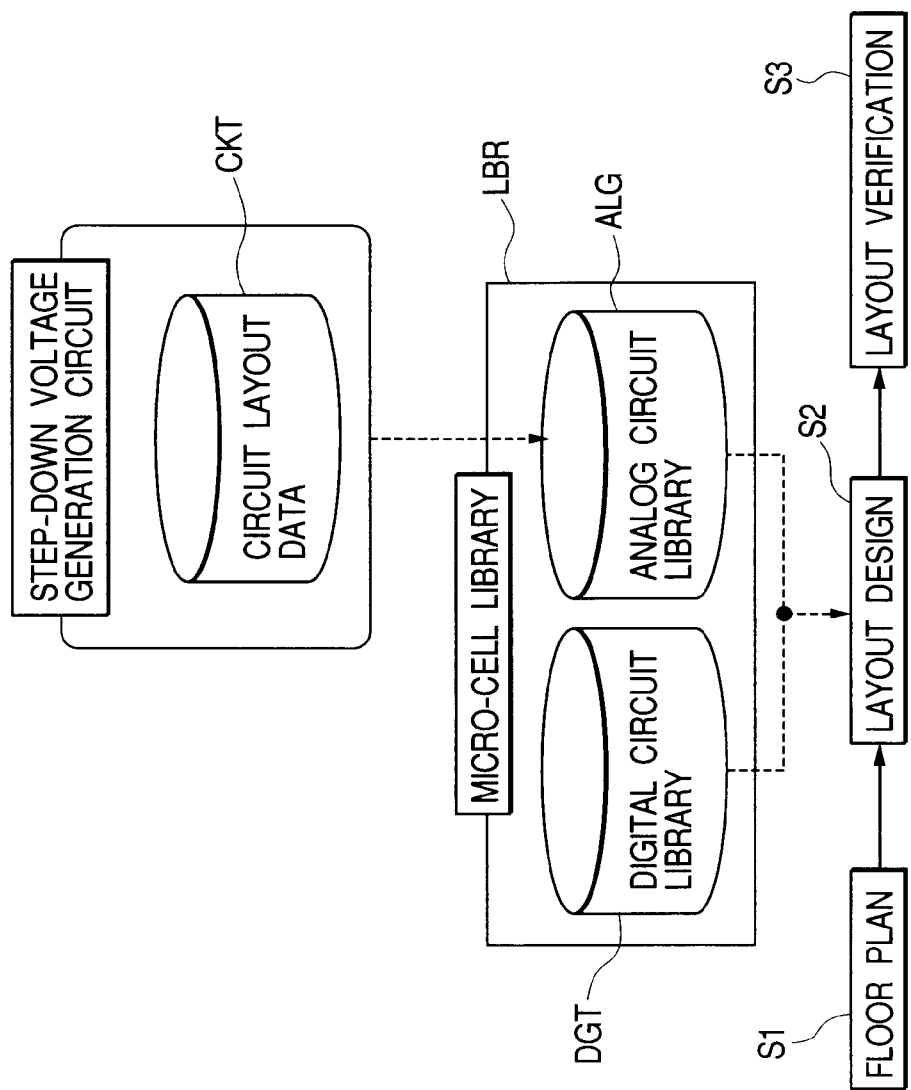
FIG. 31 is a diagram showing in brief the manner of layout design of semiconductor integrated circuits.

FIG. 31 shows in brief the layout design procedure for the foregoing semiconductor integrated circuits. The floor planning step (S1) roughly determines the layout of circuit blocks, the next layout design step (S2) designs the circuit patterns which accomplish the intended logic functions while referring to the result of floor planning, and the final layout verification step (S3) verifies the result of layout design.

The layout design uses existing circuit patterns and master pattern data which are registered in a micro-cell library (LBR) thereby to enhance the efficiency of work. The micro-cell library LBR incorporates a digital circuit library (DGT), analog circuit library (ALG), etc. The analog circuit library ALG has records of circuit layout data (CKT) of many kinds of voltage step-down circuits for the series regulators 150–157 and other circuits.

In designing a semiconductor integrated circuit having the voltage regulators 150–157, the layout design step S2 includes a process of laying the regulators 150–157 in an area which is dependent in width on the layout of the buffer 30 and located near the electrode pads of the external power voltage Vext and ground voltage Vss. For the layout of the voltage regulators, a voltage step-down circuit which meets the current capacity needed for the circuits in the third area 3 is selected from the micro-cell library LBR, and the layout design is facilitated.

Figure 32:
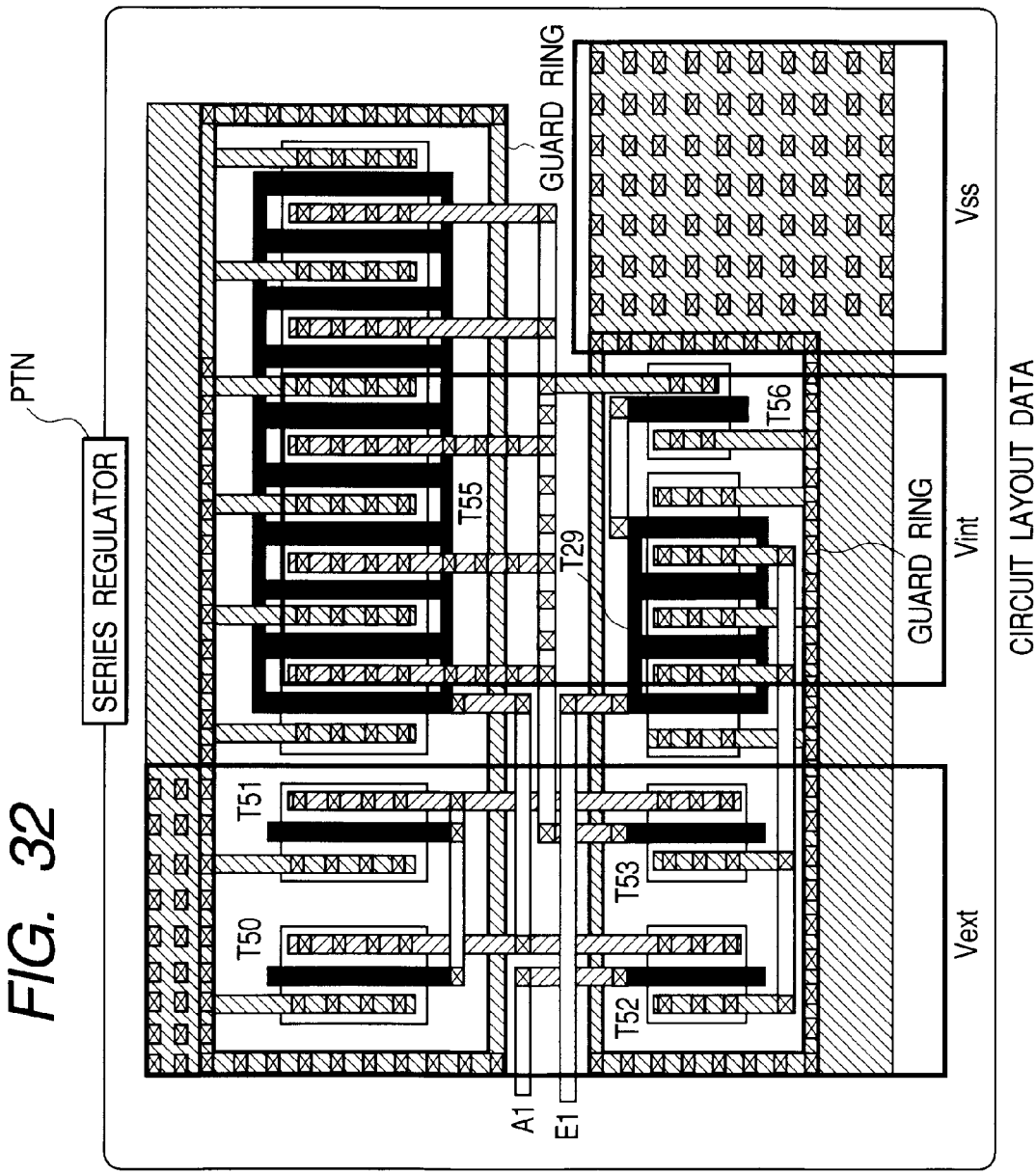
FIG. 32 is a diagram showing an embodiment of the circuit layout pattern which is derived from the mask pattern data of the series regulator.
Figure 33:
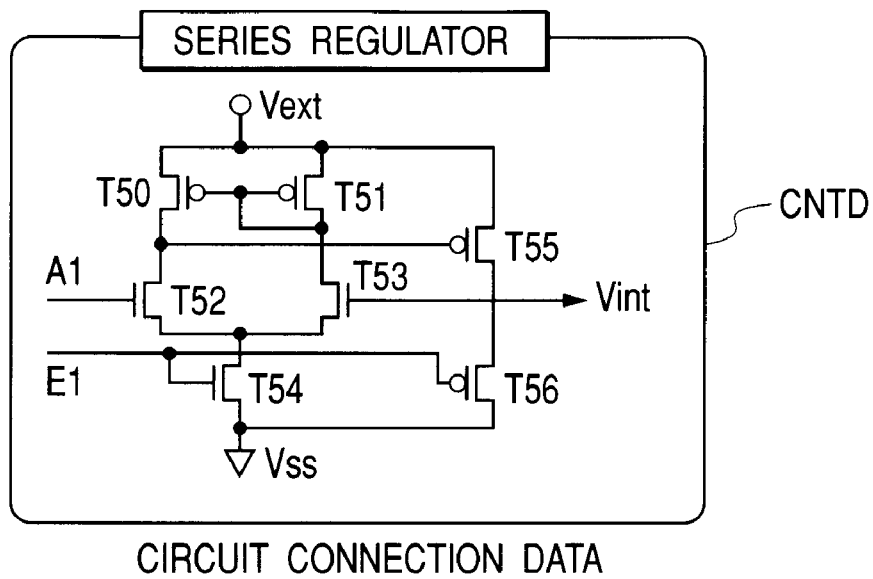
FIG. 33 is a schematic circuit diagram which is derived from the circuit connection data linked to the layout pattern of FIG. 32.
Figure 34:
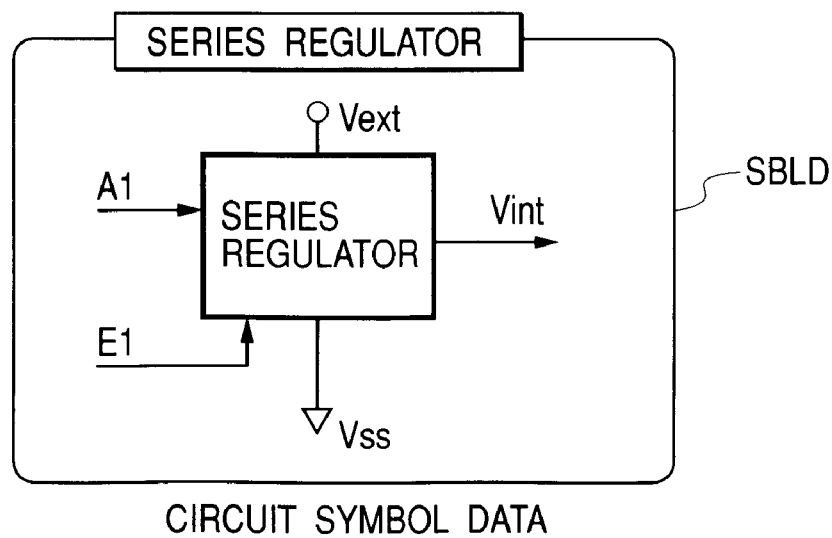
FIG. 34 is a diagram explaining the symbol which is derived from the circuit symbol data linked to the layout pattern of FIG. 32.

FIG. 32 shows, as an example, the circuit pattern (PTN) of a series regulator derived from the layout data (master pattern data) of a voltage step-down circuit. The layout data of this circuit pattern PTN is linked to circuit connection data (CNTD) shown in FIG. 33 and circuit symbol data (SBLD) shown in FIG. 34, i.e., this set of data PTN, CNTD and SBLD share information of wiring and sizes of MOS elements, etc. Symbols T50–T56 of MOS transistors, symbols A1 and E1 of signals, and symbols Vext, Vint and Vss of voltages are all common among the data shown in FIGS. 32, 33 and 34. Using these design data facilitates the circuit design and layout design of the voltage step-down circuit, and also facilitates the management of information.

Figure 38:
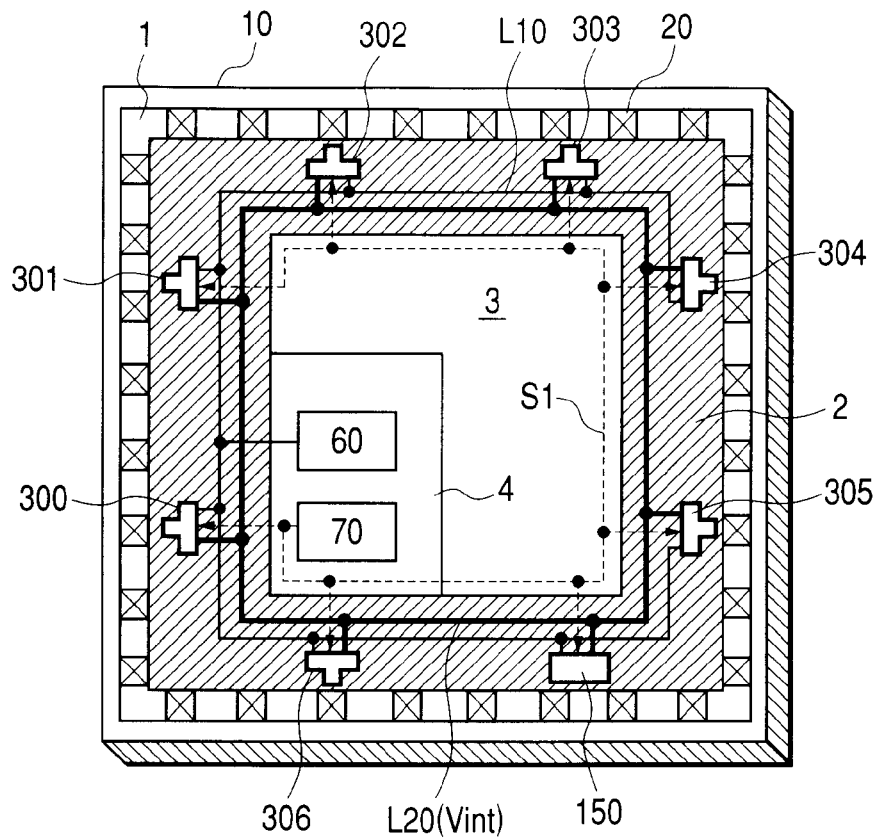
FIG. 38 is diagram explaining an embodiment of the inventive semiconductor integrated circuit.

FIG. 38 shows still another embodiment of the inventive semiconductor integrated circuit. This integrated circuit includes multiple series regulators 300–306 having a same power capacity and another series regulator 150 having a same power capacity. As a variant embodiment, a plurality of the series regulator 150 may be included, or it may be removed.

Figure 39:
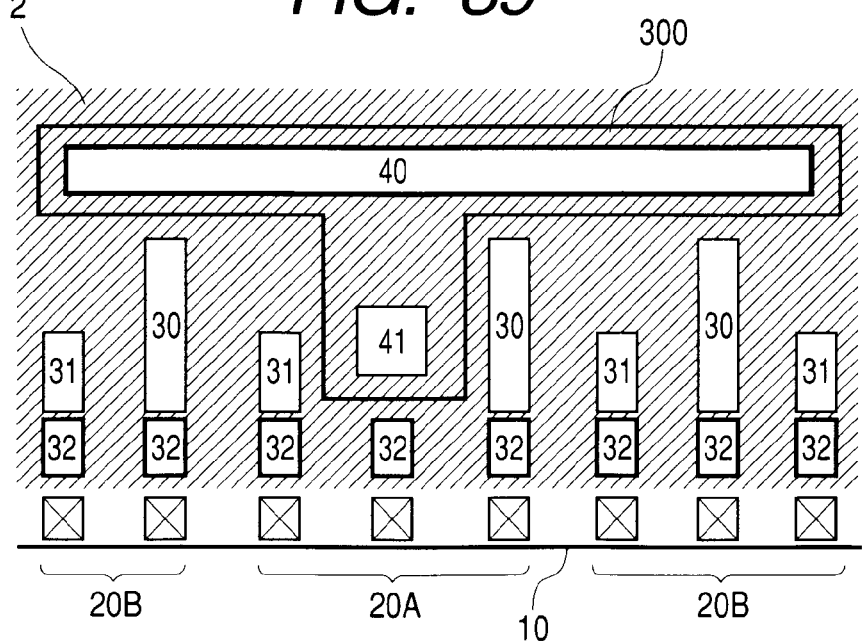
FIG. 39 is a diagram showing an embodiment of the line arrangement of the series regulator.

FIG. 39 shows the details of the series regulator 300. Other series regulators 301–306 are identical to this regulator. The series regulator 300 includes a driver transistor 40 and an amplifier 41.

In contrast to the layout of series regulator 150 explained in connection with FIG. 4 in which the driver transistor 40 and an amplifier 41 are laid in the area where the input/output buffers 30 and 31 are placed (outer side of the second area 2) and therefore all power pads 20A need to be located closely to the area, the layout of FIG. 39 merely needs an area for placing only the amplifier 41 out of the series regulator 300 within the area where the buffers 30 and 31 are placed (first circuit area adjoining the outer edge of the second area 2). The driver transistor 40 is placed in the inner section of the area (inner side of the second area 2). In consequence, the latitude of layout of the series regulators 301–306 increases. The driver transistor 40 may be substituted by a number of small transistors which are connected in parallel to have the intended current capacity as the whole.

Figure 40:
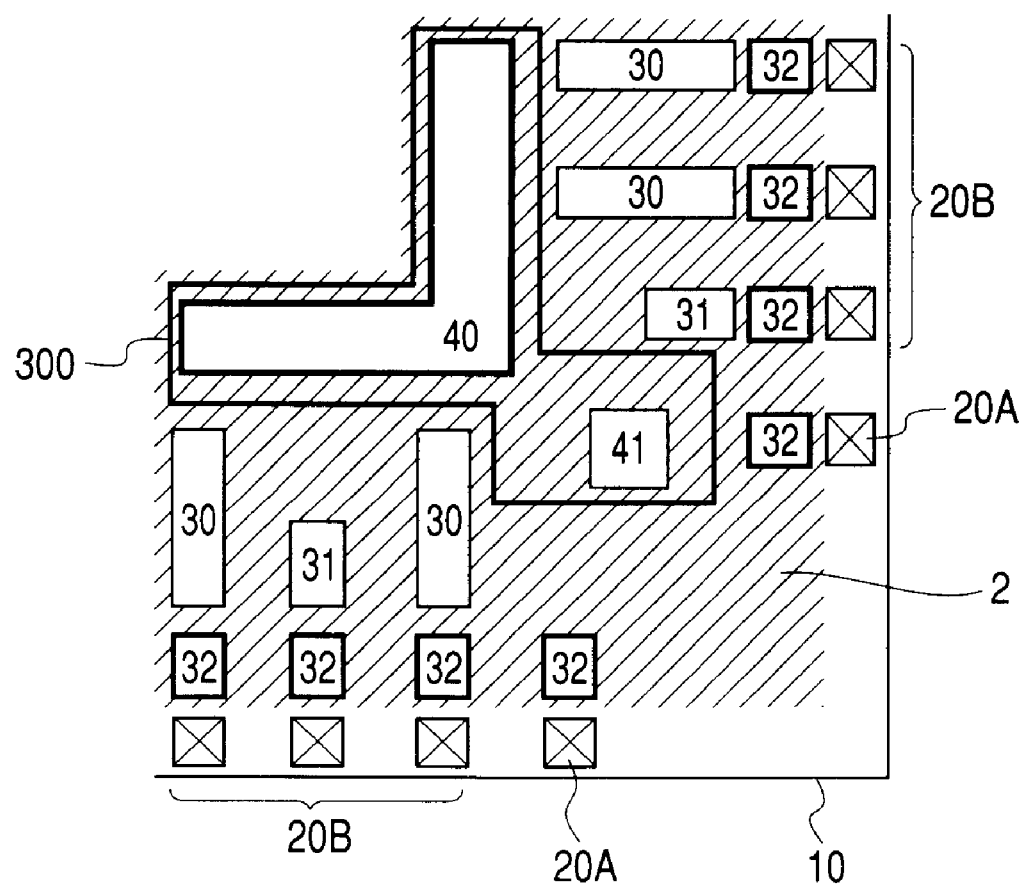
FIG. 40 is a diagram showing an embodiment of the layout of the series regulator in the chip corner section.

FIG. 40 shows another layout of the series regulator 300. A semiconductor chip 10 has vacant areas in the four corner sections of the second area 2 if electrode pads are not laid there. The amplifier 41 of the series regulator 150 is placed in such area. In the example of layout shown in FIG. 40, amplifiers 41 are placed in the four corner sections of the areas where the input/output buffers 30 and 31 are placed. In this case, the driver transistor 40 can be formed in a bent area instead of a linear area shown in FIG. 39. Some of the remaining series regulators may have the same layout configuration as FIG. 40, with the rest being laid out as shown in FIG. 39.

As described above, for an LSI device having internal circuits operating based on the internal power voltage Vint which is lower than the power voltage Vext used for the interference between chips, voltage regulators for produced the internal power voltage Vint are laid in the area for buffers and protective elements, whereby the overhead chip area caused by the inclusion of voltage step-down circuits on the chip can be reduced.

Figure 35:
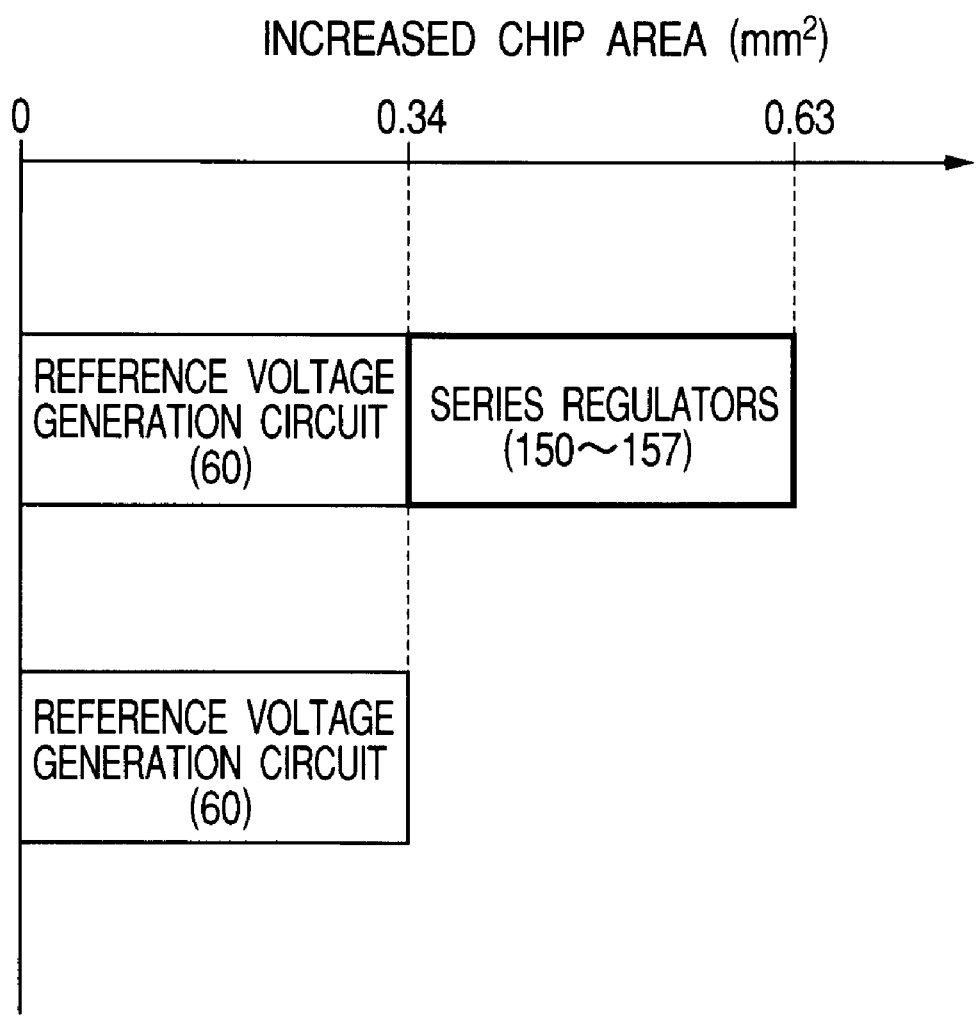
FIG. 35 is a diagram explaining an embodiment of the effect of the reduction of overhead chip area based on the circuit arrangement shown in FIG. 1.

The effectiveness in terms of the reduction of overhead chip area is shown by taking a specific example. FIG. 35 shows the reduction of overhead chip area based on the circuit arrangement of the semiconductor integrated circuit shown in FIG. 1. Relative to the conventional layout design which does not use the second area 2 for the layout of the series regulators 150–157, the inventive layout scheme gets rid of the overhead chip area caused by the series regulators, resulting in the reduction of the increase of chip area from 0.63 mm² to 0.34 mm².

Figure 36:
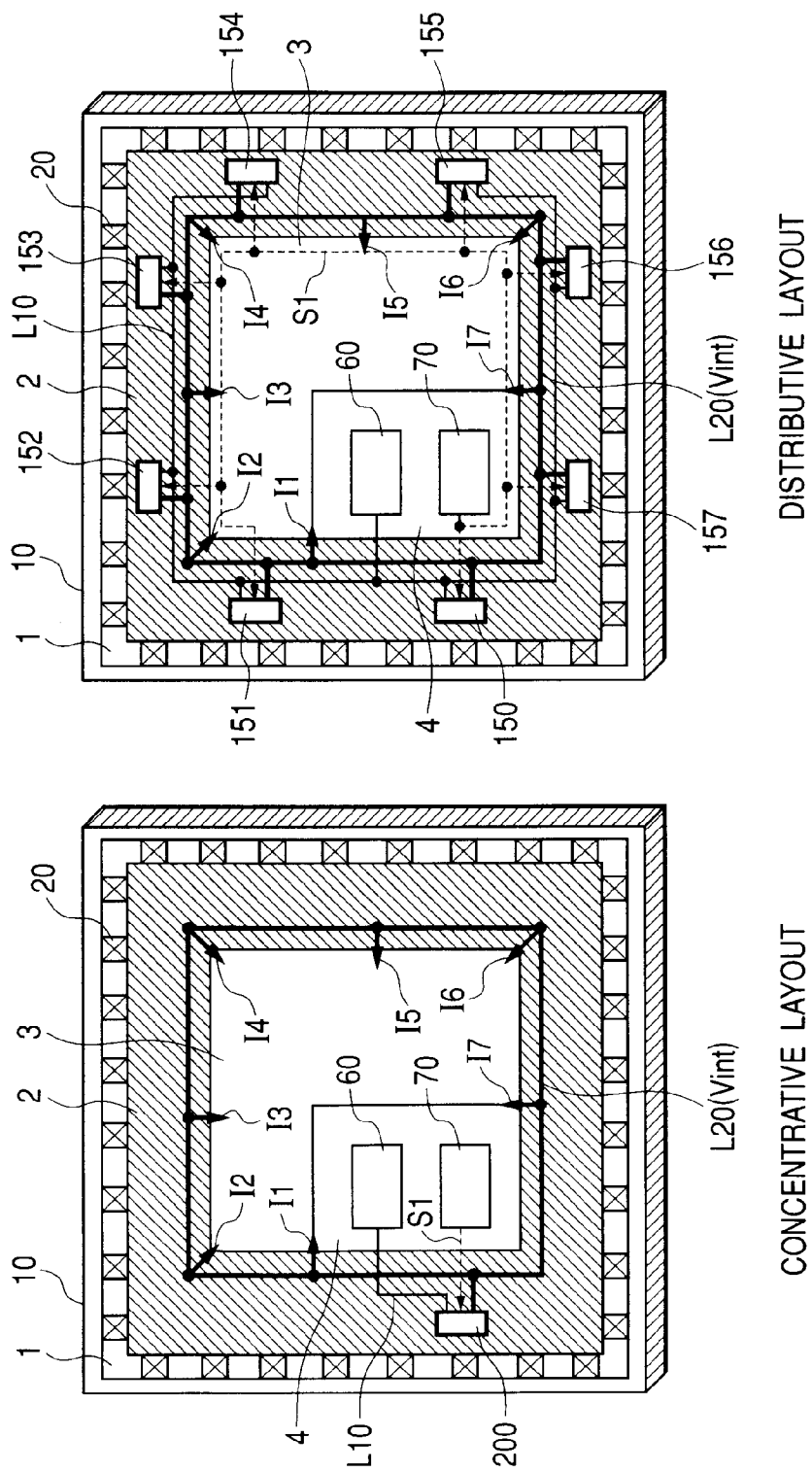
FIGS. 36A and 36B are diagrams showing the semiconductor integrated circuits having a concentrative series regulator and distributive series regulators, respectively.

The effectiveness in terms of the reduction of undesired power voltage drop is shown by taking a specific example. FIG. 36A shows a semiconductor integrated circuit which includes a single series regulator 200 having a sufficient current capacity for the semiconductor chip 10, and FIG. 36B shows a semiconductor integrated circuit which has a distributive layout of multiple series regulators 150–157 having a total current capacity equal to or more than that of the regulator 200 of FIG. 36A.

Figure 37:
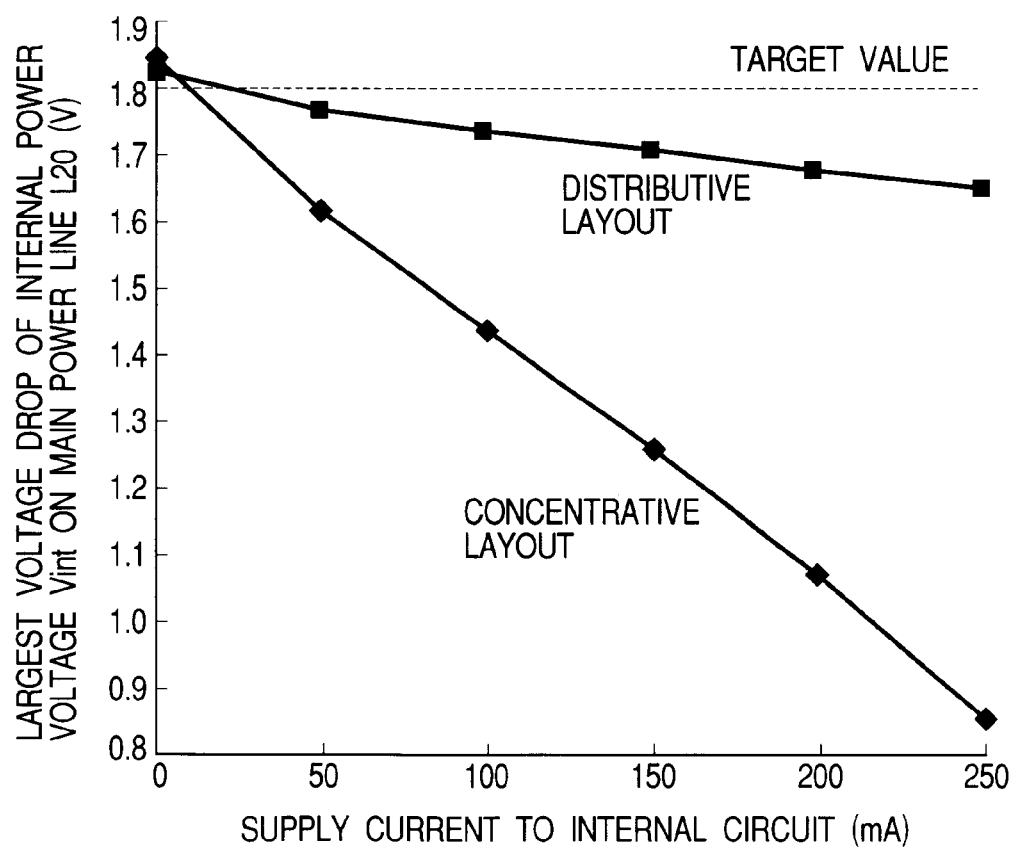
FIG. 37 is a graph explaining an embodiment of the effect of the reduction of voltage drop on the main power line.

FIG. 37 is a graph showing the maximum voltage drops of the internal power voltage Vint on the main power line L20 plotted for several total values of supply currents I1–I7 of the internal circuits in the third area 3 of the semiconductor integrated circuit shown in FIGS. 36A and 36B. In the case of a total current supply of 200 mA, for example, the concentrative regulator of FIG. 36A causes a voltage drop of about 0.7 V, whereas the distributive regulators of FIG. 36B causes a voltage drop of about 0.1 V. The comparison on this graph reveals that by laying a number of series regulators virtually equidistantly along the main power line L20 which runs round on the chip as shown in FIG. 1, it becomes possible to minimize the voltage drop of the internal power voltage Vint even in the case of a large supply current.

Although the present invention has been explained in connection with the specific embodiments, the present invention is not confined to these embodiments, but various alterations are obviously possible without departing from the essence of the invention.

For example, the number of series regulators, their arrangement, and functions of the circuits formed in the third area are not confined to the foregoing embodiments, but they can be altered. The present invention is not confined to microcomputers or microprocessors having CPUs, but is further applicable to various application appliances of semiconductor integrated circuits including communication protocol controllers and accelerators. Electrode pads are not confined to bonding pads, but can be bumps used for chip-wise packaging. Positions of electrode pads and buffers are not confined to the edge sections of semiconductor chip, but can be the central section.

Although the inventive semiconductor integrated circuit is best suited for portable information terminals such as portable telephone sets owing to its small power consumption, it is not confined to these appliances, but can be applied extensively to various logic LSI application appliances.

The effectiveness achieved by the foregoing embodiments of this invention is briefed as follows.

For a semiconductor integrated circuit having internal circuits operating based on the internal power voltage which is lower than the external power voltage, voltage regulators for produced the internal power voltage are laid in the area for buffers and protective elements, or in the buffer layout area having its width generally determined from the buffer layout width, whereby the overhead chip area caused by the on-chip provision of voltage step-down circuits can be reduced.

A looped main power line is used for the distribution of the step-down voltage, with electrode pads for the connection of an external stabilizing capacitor being connected to the main power line. Depending on the operation mode, the reference voltage for determining the step-down voltage is switched, the voltage regulators are turned on or off, and the substrate bias voltage is controlled by using the external power voltage or step-down voltage, whereby the power conservation is fostered.

In designing a semiconductor integrated circuit having voltage regulators, the regulators are laid in the area having its width generally determined from the buffer layout size and near the electrode pads for the first power voltage and ground voltage. The voltage regulators to be laid are selected from the cell library depending on the current capacity needed by the first internal circuits, whereby the layout design of the semiconductor integrated circuit is facilitated.

What is claimed is:

1. A semiconductor integrated circuit on a semiconductor chip, comprising:
   a plurality of terminals connected to outside;
   buffers and protection circuits connected to the terminals;
   a plurality of regulators which step down a first power voltage which is supplied from the outside to a certain terminal thereby to produce at least one kind of internal power voltage which is lower than the first power voltage; and
   a first internal circuit which operates based on the internal power voltage,
   wherein the regulators are set in an area including the buffers and protection circuits, and its width is generally determinable from the layout width of the buffers and protection circuits.

2. A semiconductor integrated circuit according to claim 1, further comprising:
   a power line connected to the outputs of the regulators and providing the internal power voltage to the first internal circuit.

3. A semiconductor integrated circuit according to claim 2, wherein the power line is formed in a closed loop.

4. A semiconductor integrated circuit according to claim 3, wherein the power line contains a generally equal parasitic resistance of line segments between output nodes of the voltage regulators.

5. A semiconductor integrated circuit according to claim 3, wherein the power line includes a generally equal length of line segments between output nodes of the voltage regulators.

6. A semiconductor integrated circuit according to claim 2, further comprising:
   a terminal connected to said power line.

7. A semiconductor integrated circuit according to claim 1, further comprising:
   a second internal circuit operatable based on the first power voltage,
   wherein the second internal circuit includes a converting circuit which converts the signal outputted from the first internal circuit to logic levels derived from the first power voltage.

8. A semiconductor integrated circuit according to claim 1, further comprising:
   a second internal circuit operatable based on the first power voltage,
   wherein the second internal circuit includes a reference voltage generation circuit providing a reference voltage for a step-down voltage to the regulators.

9. A semiconductor integrated circuit according to claim 8, further comprising:
   a reference voltage line formed in an open loop for providing the reference voltage to the regulators.

10. A semiconductor integrated circuit according to claim 9, wherein the reference voltage line is laid to run generally along the layout of the regulators, with a shield line having the ground voltage being formed in parallel thereto on the same wiring layer.

11. A semiconductor integrated circuit according to claim 10, further comprising: shield lines or shield areas formed above and below the reference voltage line.

12. A semiconductor integrated circuit according to claim 8, wherein the reference voltage generation circuit provides the reference voltage based on the output voltage of a reference voltage generator having its circuit characteristics determined by trimming information, and includes an electrically-writable nonvolatile memory storable the trimming information.

13. A semiconductor integrated circuit according to claim 8, wherein the reference voltage generation circuit is capable of outputting a reference voltage based on selection from among a plurality of reference voltages.

14. A semiconductor integrated circuit according to claim 13, wherein the reference voltage generation circuit is capable of selecting a reference voltage in response to a signal provided from a control unit depending on the operation mode.

15. A semiconductor integrated circuit according to claim 1, further comprising:
   a second internal circuit which operates based the first power voltage,
   wherein the second internal circuit comprising an activation control unit which turns on or off the regulators.

16. A semiconductor integrated circuit according to claim 15, wherein the activation control unit is capable of turning on or off each of or each group of regulators separately.

17. A semiconductor integrated circuit according to claim 15, wherein one or multiple ones of the voltage regulators have a smaller current supply capacity or smaller power consumption relative to the rest,
   wherein the activation control unit turns on all of the regulators or regulators excluding the regulator(s) having a smaller current supply capacity or smaller power consumption in response to a first operation mode of the integrated circuit, and turns on the voltage regulator(s) having a smaller current supply capacity or smaller power consumption in response to a second operation mode of the integrated circuit.

18. A semiconductor integrated circuit according to claim 15, wherein the second internal circuit includes a sub regulator which is smaller in current supply capacity or power consumption than the regulators, the activation control means turning on the regulators in response to a first operation mode of the integrated circuit, and turning on the sub regulator in response to a second operation mode of the integrated circuit.

19. A semiconductor integrated circuit according to claim 1, further comprising:
   a second internal circuit operatable based on the first power voltage;
   a power line connected to the outputs of the regulators and providing the internal power voltage to the first internal circuit; and
   a terminal connected to the power line,
   wherein the second internal circuit includes a driver control circuit for a switching regulator, the integrated circuit further includes a terminal which is assigned to the external output terminal of the drive control signal produced by the driver control circuit.

20. A semiconductor integrated circuit according to claim 19, further comprising:
   a deactivation control unit which deactivates one of the regulators or the driver control circuit permanently.

21. A semiconductor integrated circuit according to claim 1, further comprising:
   a second internal circuit which operates based on the first power voltage,
   wherein the second internal circuit includes a substrate bias control circuit which controls the substrate voltage of switching elements included in the first internal circuit, and
   wherein the substrate bias control circuit operates based on the first power voltage and the internal power voltage to control the substrate voltage depending on the operation mode of the integrated circuit.

22. A semiconductor integrated circuit according to claim 1, further comprising:
   a second internal circuit which operates based on the first power voltage,
   wherein the second internal circuit includes a substrate bias control circuit which controls the substrate voltage of switching elements included in the first internal circuit, and
   wherein said substrate bias control circuit operates based on the first power voltage and the internal power voltage to apply a negative bias for substrate to the switching elements in the standby mode of the first internal circuit.

23. A semiconductor integrated circuit according to claim 21, wherein the substrate bias control circuit provides the substrate voltages in the first internal circuit, which are derived from the internal power voltage and a ground voltage in response to a first operation mode of the integrated circuit, and provides the substrate voltages in the first internal circuit, which are derived from the first power voltage and a negative voltage which is produced by stepping down a ground voltage in response to a second operation mode of the integrated circuit.

24. A method of designing a semiconductor integrated circuit comprising:
   a plurality of terminals connected to outside;
   a plurality of buffers and protection circuits connected to said terminal;
   a plurality of regulators which step down a first power voltage which is supplied from the outside to a certain terminal thereby to produce at least one kind of internal power voltage which is lower than the first power voltage; and
   a first internal circuit operatable based on the internal power voltage,
   wherein the method including a step of laying said regulators in an area having its width generally determined from the layout width of said buffers and at positions near the external terminals for receiving the first power voltage and a ground voltage.

25. A method of designing a semiconductor integrated circuit according to claim 24,
   wherein the step of said method includes steps of setting regulators which are selected from a cell library depending on the current capacity needed by said first internal circuit.

26. A semiconductor integrated circuit on a semiconductor chip comprising:
   a first area which lays a plurality of terminals connected to outside;
   a second area which lays buffers and protection circuits connected to said terminals, and a plurality of voltage regulators which step down a first power voltage which is supplied from the outside to a certain terminal thereby to produce at least one kind of internal power voltage which is lower than the first power voltage;

a third area which lays a first internal circuit which operates based on the internal power voltage; and a fourth area which lays a second internal circuit which operates based on the first power voltage, wherein said regulators are laid at positions near the terminals for receiving the first power voltage and a ground voltage, and connected to a power line, and wherein said power line provides the internal power voltage to said first internal circuit.

27. A semiconductor integrated circuit according to claim 26, wherein said power line is formed to be a closed loop and include a generally equal parasitic resistance of line segments between output nodes of said voltage regulators.

28. A semiconductor integrated circuit according to claim 27 further comprising a terminal connected to said power line.

29. A semiconductor integrated circuit on a semiconductor chip, comprising:

a plurality of terminals connected to outside;

buffers and protection circuits connected to said terminals;

a plurality of regulators which step down a first power voltage which is supplied from the outside to a certain terminal thereby to produce at least one kind of internal power voltage which is lower than the first power voltage;

a first internal circuit operatable based on the internal power voltage; and a second internal circuit operatable based on the first power voltage, wherein said regulators is laid near the terminals for receiving the first power voltage and a ground voltage, and connected to a power line, wherein said power line provides the internal power voltage to said first internal circuit, wherein said second internal circuit includes a signal level converting circuit which converts the signal outputted from said first internal circuit to have logic levels derived from the first power voltage, a reference voltage generation circuit which provides a reference voltage for a step-down voltage to said regulators, and a CPU, and wherein said reference voltage generation circuit is capable of outputting a reference voltage based on selection from among a plurality of reference voltages and adapted to select a reference voltage in response to a signal which is given by said CPU.

30. A semiconductor integrated circuit on a semiconductor chip comprising:

a plurality of terminals connected to outside;

buffers and protection circuits connected to said terminals;

a plurality of regulators; and a first internal circuit, wherein said regulators step down a first power voltage supplied from the outside thereby to produce at least one kind of internal power voltage which is lower than the first power voltage, wherein said first internal circuit operates based on the internal power voltage, and wherein said regulators each includes a transistor circuit formed of an amplifier circuit and at least one transistor.

31. A semiconductor integrated circuit according to claim 30, wherein said amplifier circuit is located within the area where said terminals, buffers and protection circuits are arranged, and said transistor circuit is located inner than said terminals, buffers and protection circuits on said semiconductor chip.

32. A semiconductor integrated circuit according to claim 30, wherein said area of terminals, buffers and protection circuits extends along at least one side of said semiconductor chip, wherein said amplifier circuit is within said area of terminals, buffers and protection circuits, and wherein said transistor circuit is inner than said area of amplifier circuit on said semiconductor chip.

33. A semiconductor integrated circuit on a semiconductor chip comprising:

a terminal area including a plurality of terminals connected to outside;

a first circuit area where buffers and protection circuits connected to said terminals are formed, said first circuit area including a plurality of regulators which step down a first power voltage supplied from the outside thereby to produce at least one kind of internal power voltage which is lower than the first power voltage;

a second circuit area where a first internal circuit operating based on the internal power voltage is laid; and a third circuit area where a second internal circuit operating based on the first power voltage is laid, wherein said regulators each includes a transistor circuit formed of an amplifier circuit and at least one transistor, and wherein said amplifier circuit is located within said first circuit area.

34. A semiconductor integrated circuit according to claim 33, wherein said transistor circuit is located between said first circuit area and said second circuit area, or between said first circuit area and said third circuit area.

35. A semiconductor integrated circuit according to claim 33, wherein said transistor circuit is located inner than said first circuit area and outer than said second circuit area and third circuit area on said semiconductor chip.

* * * * *